US011630138B2

(12) United States Patent
Guddeti et al.

(10) Patent No.: US 11,630,138 B2
(45) Date of Patent: Apr. 18, 2023

(54) HIGH RESOLUTION SPECTRUM MONITORING

(71) Applicant: The Regents of the University of California, Oakland, CA (US)

(72) Inventors: Yeswanth Reddy Guddeti, San Diego, CA (US); Dinesh Bharadia, San Diego, CA (US); Moein Khazraee, San Diego, CA (US); Aaron Shalev, San Diego, CA (US); Raghav Vaidyanathan Subbaraman, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 377 days.

(21) Appl. No.: 16/849,659

(22) Filed: Apr. 15, 2020

(65) Prior Publication Data

US 2020/0326362 A1 Oct. 15, 2020

Related U.S. Application Data

(60) Provisional application No. 62/834,085, filed on Apr. 15, 2019.

(51) Int. Cl.
*G01R 23/165* (2006.01)
*G01R 13/02* (2006.01)
*G01R 23/173* (2006.01)

(52) U.S. Cl.
CPC ......... *G01R 23/165* (2013.01); *G01R 13/029* (2013.01); *G01R 13/0272* (2013.01); *G01R 23/173* (2013.01)

(58) Field of Classification Search
CPC .............. G01R 13/0272; G01R 13/029; G01R 23/165; G01R 23/173
See application file for complete search history.

(56) References Cited

U.S. PATENT DOCUMENTS 3,427,536 A * 2/1969 Wainwright ........... G01R 13/30 327/100
5,587,717 A * 12/1996 Jang .................. H04B 7/18571 342/359
6,256,485 B1 * 7/2001 Heard ...................... H04B 1/28 455/161.1

(Continued)

OTHER PUBLICATIONS

3GPP Consortium. 3GPP Specification series 36.http://www.3gpp.org/dynareport/36-series.htm.

(Continued)

*Primary Examiner* — Huy Q Phan
*Assistant Examiner* — Adam S Clarke
(74) *Attorney, Agent, or Firm* — Mintz Levin Cohn Ferris Glovsky and Popeo, P.C.

(57) ABSTRACT

A method, a system, and a computer program for executing high resolution spectrum monitoring. A sensor receives an input signal having a varying frequency content over time. One or more samples of the received input signal are sampled. The samples of the received input signal include one or more swept signal samples generated by sweeping, using a center frequency of the sensor, the received input signal across an entire frequency spectrum associated with the received input signal. Sampling of the samples of the received signal is performed while performing the sweeping. The signal samples are processed.

18 Claims, 18 Drawing Sheets

102 104 107 105b 103c 115 115 113 Time 103a 103b 107 Frequency 105a Time Frequency Sampling Transmitting Sensed Missed

(56) References Cited

U.S. PATENT DOCUMENTS

2003/0117319 A1* 6/2003 Rideout .................... G01S 5/06 342/453
2020/0132741 A1* 4/2020 Nishimura ............. G01R 23/02

OTHER PUBLICATIONS

Anritsu. MS2840A Spectrum Analyzer, <https://www.anritsu.com/en-IN/testmeasurement/solutions/ms2840a-066/>.
M. R. Avendi, K. Haghighi, A. Panahi, and M. Viberg. A NLLs based sub-nyquist rate spectrum sensing for wideband cognitive radio. CoRR,abs/1408.4544, 2014.
P. Bahl, R. Chandra, T. Moscibroda, R. Murty, and M.Welsh. White space networking withWi-Fi like connectivity. In Proc. ACM SIGCOMM, 2009.
E. K. Base. Uhd and usrp user manual—ettus knowledge base,, 2016. [Online; accessed Jun. 22, 2018].
C. M. Bishop. Pattern Recognition and Machine Learning (Information Science and Statistics).Springer-Verlag, Berlin, Heidelberg, 2006.
A. M. Cavalcante, E. Almeida, R. D. Vieira,S. Choudhury, E. Tuomaala, K. Doppler, F. Chaves, R. C. D. Paiva, and F. Abinader. Performance evaluation of lte and wi-fi coexistence in unlicensed bands. In IEEE Vehicular Technology Conference (VTC Spring), Jun. 2013.
Chad Spooner. Cyclostationarity blog, <https://cvclostationary.blog/>.
W. A. Gardner. The spectral correlation theory of cyclostationary time-series. Signal Processing, 11(1), Jul. 1986.
A. P. Goodson. A multi-function, broad band, high dynamic range RF receiver. Technical report, OneRadio, 2017. [http://www.oneradiocorp.com/wp-content/uploads/2021/04/OneRadio-Press-Release-April-12-2021.pdf; and http://www.oneradiocorp.com/oneradio-receiver/].
H. Hassanieh, L. Shi, O. Abari, E. Hamed, and D. Katabi. GHz-Wide sensing and decoding using the sparse fourier transform. In Proc. IEEE Conference on Computer Communications (INFOCOM), 2014.
S. S. Hong and S. R. Katti. DOF: a local wireless information plane. In Proceedings of the Acm Sigcomm 2011 Conference on Applications, Technologies, Architectures, and Protocols for Computer Communications, Toronto, ON, Canada, Aug. 15-19, 2011, pp. 230-241, 2011.
IEEE. IEEE 802.11: Wireless LAN Medium Access Control (MAC) and Physical Layer (PHY) Specifications. (2016 revision). IEEE-SA.Dec. 14, 2016. <http://ieeexplore.ieee.org/document/7786995/>.
IEEE Standard. "802.15.4k-2013—IEEE Standard for Local and metropolitan area networks-Part 15.4: Low-Rate Wireless Personal Area Networks (LR-WPANs)-Amendment 5: Physical Layer Specifications for Low Energy, Critical Infrastructure Monitoring Networks.". https://ieeexplore.ieee.org/document/6581828/.
IEEE Standard. "IEEE Std 802.15.12005 IEEE Standard for Information technology Telecommunications and information exchange between systems Local and metropolitan area networks Specific requirements Part 15.1: Wireless Medium Access Control (MAC) and Physical Layer (PHY) Specifications for Wireless Personal Area Networks (W Pans)". Ieeexplore.ieee.org.
K. Lakshminarayanan, S. Sapra, S. Seshan, and P. Steenkiste. Rfdump: An architecture for monitoring the wireless ether. In Proceedings of the 5th International Conference on Emerging Networking Experiments and Technologies, CoNEXT '09, pp. 253-264, New York, NY, USA, 2009. ACM.
E. Like, V. D. Chakravarthy, P. Ratazzi, and Z. Wu. Signal classification in fading channels using cyclic spectral analysis. EURASIP J. Wirel. Commun. Netw., 2009:29:1-29:14, Jan. 2009.
Maxim Integrated. 23.5MHz to 6000 MHz Fractional Integer-N synthesizer/VCO. <http://hforsten.com/third-version-of-home-made->6-ghz-fmcw-radar.html.
MetaGeek. Wi-Spy and Chanalyzer. <https://www.metageek.com/products/wi-spy/>.
Oscor. Blue Spectrum Analyzer, <https://reiusa.net/rf-detection/oscor-blue-spectrum-analyzer/>.
S. Rayanchu, A. Patro, and S. Banerjee. Airshark:Detecting non-WiFi RF devices using commodity WiFi hardware. In Proc. ACM Internet Measurement Conference (IMC), 2011.13.
S. Roy, K. Shin, A. Ashok, M. McHenry, G. Vigil, S. Kannam, and D. Aragon. Cityscape: A metroarea spectrum observatory. In Proc. IEEE International Conference on Computer Communication and Networks (ICCCN), 2017.
L. Shi, P. Bahl, and D. Katabi. Beyond sensing: Multi-GHz realtime spectrum analytics. In Proc. Symposium on Networked Systems Design and Implementation (NSDI), 2015.
G. Yuan, X. Zhang, W. Wang, and Y. Yang. Carrier aggregation for LTE-Advanced mobile communication systems. IEEE Communications Magazine, 48(2):88-93, Feb. 2010.
M. Zheleva, P. Bogdanov, T. Larock, and P. Schmitt. Airview: Unsupervised transmitter detection for next generation spectrum sensing. In IEEE INFOCOM 2018—IEEE Conference on Computer Communications Workshops (INFOCOM Wkshps), pp. 1-2, Apr. 2018.

* cited by examiner 200
202
201
204
208
Sweep Frequency (Chirp) Compensation and Sampling Component
210
Signal Processing Component
Sweep Frequency (Chirp) Generation Component
206

702
Symbol Time
τ (Delay)
α (Pattern Freq)
-100
-50
0
50
100
-0.05
0
0.05

704
Symbol Time
τ (Delay)
α (Pattern Freq)
-100
-50
0
50
100
-0.05
0
0.05

HIGH RESOLUTION SPECTRUM MONITORING

CROSS-REFERENCE TO RELATED APPLICATIONS

The present application claims priority to U.S. Provisional Patent Appl. No. 62/834,085 to Guddeti et al., filed Apr. 15, 2019, and entitled "High Resolution Spectrum Monitoring", and incorporates its disclosure herein by reference in its entirety.

TECHNICAL FIELD

The current subject matter generally relates to data processing, and in particular, a low-cost receiver architecture that may be configured to sense widebands of spectrum with a high-time resolution.

BACKGROUND

Spectrum sensing is a process for periodically monitoring a specific frequency band to identify presence or absence of primary users. As the technology developed and new services were introduced utilizing the electromagnetic spectrum, spectrum utilization has significantly increased causing spectrum utilization overlap to occur, i.e., utilization of the same band by different services. To resolve this, spectrum licensing was introduced to exclusively allocate spectrum to different wireless services. However, conventional systems are not capable of achieving high dynamic range spectrum sensing over a wide bandwidth at high speeds.

SUMMARY

In some implementations, the current subject matter relates to a method for performing spectrum monitoring. The method may include receiving, at a sensor, an input signal having a varying frequency content over time, and sampling one or more samples of the received input signal. The samples of the received input signal include one or more swept signal samples generated by sweeping. Sweeping may be performed using a center frequency of the sensor, where the received input signal may be swept across an entire frequency spectrum associated with the received input signal. Sampling of the or more samples of the received signal may be performed while performing the sweeping. The method may also include processing the signal samples.

In some implementations, the current subject matter may include one or more of the following optional features. In some implementations, sweeping may further include down-converting the one or more swept signal samples to one or more baseband signal samples. The method may also include compensating and sampling the generated swept signal samples to generate one or more unswept signal samples. Compensating and sampling may be configured to remove one or more distortions from the generated unswept signal samples. The processing may be applied to the generated unswept signal samples having distortions removed.

In some implementations, down-converting may be performed using at least one of the following: direct down-converting of the one or more swept signal samples, down-converting the one or more swept signal samples from a radio frequency to an intermediate frequency, and any combination thereof.

In some implementations, the method may also include monitoring, using the sensor, based on the samples of the received input signal, a usage of the frequency spectrum. The method may further include determining, based on the sweeping, an amount of gain to apply to the one or more swept signal samples.

In some implementations, a spectrum sensor may be configured to perform the sweeping using the center frequency of the spectrum sensor. In some implementations, the spectrum sensor may include at least one of the following: a software defined radio, a custom designed radio, and any combinations thereof, and/or one or more of its components.

In some implementations, the method may further include selecting one or more frequency bands in a plurality of frequency bands for the sweeping.

In some implementations, the sensor may include a local oscillator (LO) configured to perform the sweeping by generating, using a frequency synthesizer of the sensor, for each signal sample, a tuning tone having a sweep reference signal. The generated tuning tone may be mixed with the received signal. The received signal may be amplified to generate one or more mixed signal samples. The mixed signal may then be down-converted to one or more baseband signal samples, and then filtered and sampled, using an analog-to-digital converter of the sensor, to generate the one or more swept signal samples.

In some implementations, the compensating and sampling may include calibrating the frequency synthesizer using the sweep reference signal, measuring, for each signal sample, an observed frequency, and determining, for each signal sample, the center frequency used during the sweeping, based a difference between the observed frequency and the sweep reference signal. Further, the compensating and sampling may further include compensating the generated swept signal samples using the determined center frequency.

In some implementations, the method may further include filtering, using one or more filtering components, the mixed signal samples, sampling, using one or more sampling components, the filtered mixed signal samples, and storing the signal samples.

In some implementations, receiving may further include filtering the received input signal prior to the sweeping. The filtered received input signal and a sweep frequency chirp generated during the sweeping may be mixed to generate one or more mixed signal samples. Using an intermediate frequency filter component, the mixed signal samples may be filtered to generate a moving frequency window. The filtered mixed signal samples may be direct down-converted to one or more baseband signal samples. Filtering and sampling may then be applied to the baseband signal samples to generate the swept signal samples.

In some implementations, filtering may be performed using a predetermined fixed intermediate frequency filter.

Implementations of the current subject matter can include, but are not limited to, systems and methods consistent including one or more features are described as well as articles that comprise a tangibly embodied machine-readable medium operable to cause one or more machines (e.g., computers, etc.) to result in operations described herein. Similarly, computer systems are also described that may include one or more processors and one or more memories coupled to the one or more processors. A memory, which can include a computer-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to spectrum monitoring, it should be readily understood that such features are not intended to be limiting. The claims that follow this disclosure are intended to define the scope of the protected subject matter.

DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

Figure 1:
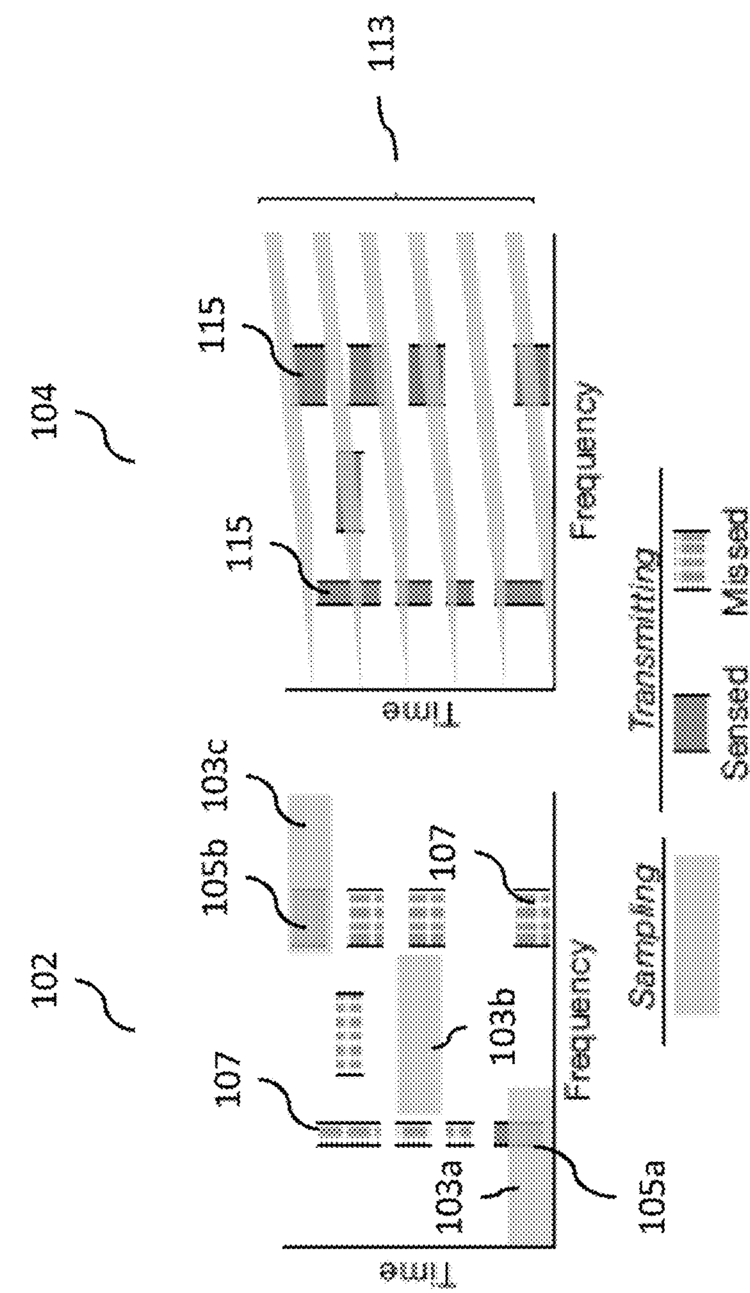
FIG. 1 illustrates a comparison between time-frequency plots and corresponding to conventional tuning and capture systems and current subject matter's system, respectively.

One or more implementations of the current subject matter relate to methods, systems, articles of manufacture, and the like that may, among other possible advantages, provide a low-cost receiver architecture that may be configured to sense widebands of spectrum with a high-time resolution.

In some implementations, the current subject matter relates to a spectrum sensing system and/or architecture that may include one or more spectrum sensors that may be configured to perform rapid sweeping of large bandwidths in a short period of time. In particular, the current subject matter may be configured to provide a direct chirp (e.g., a sweep signal in which a frequency increases (up-chirp) or decreases (down-chirp) with time (e.g., as used in spread-spectrum communications) sweep sampling down-conversion architecture. Alternatively, or in addition to, the current subject matter may be configured to provide a superheterodyne chirp/sweep sampling down-conversion architecture with automatic gain control.

I. Direct Chirp Sweep Sampling Down-Conversion Architecture

In some implementations, the current subject matter system may be configured implement use of modified software defined radios capable of rapidly sweeping the spectrum. Software defined radio (SDR) is a radio communication system where components that are typically implemented in hardware (e.g., mixers, filters, amplifiers, modulators/demodulators, detectors, etc.) are instead implemented using software on a personal computing and/or embedded system. The current subject matter system, in order to overcome a problem of capturing only a small number of distorted samples of transmissions in the spectrum, may be configured to correct distortion using self-generated calibration data, and to classify the protocol that originated each transmission with only a fraction of transmission's samples. The resulting samples may contain sufficient signal to identify the protocol that originated a transmission in various bands (e.g., the heavily used industrial, scientific and medical (ISM) bands), and for other complex use cases.

Today's unlicensed spectrum is chaotic and difficult to manage. One of the most recent examples of this problem is introduction of LTE base stations into the same unlicensed bands used by WiFi. With high-time resolution sensing, a third party spectrum sensor can observe and classify all transmissions in the unlicensed bands. This information can be used to coordinate and evaluate the introduction of new technologies into the spectrum. Currently, the licensed spectrum is coarsely divided up by provider and individual base station. Within a provider, LTE carrier aggregation has made it possible for a user to receive transmissions across bands.

By monitoring the load across all providers and base-stations at high-time resolution, a third-party can form a decentralized control plane in the field to provide multi-provider (i.e., multi-SIM) users with information about which network to operate on, and can be a reliable source of information for providers to coordinate carrier aggregation-style timesharing their licensed spectrum.

Unfortunately, there is an inherent tradeoff in spectrum sensing between the time resolution of the sensors as well as frequency coverage, and the spatial density of their deployment, i.e., without both, spectrum sharing opportunities cannot be generated. The issue is that the time resolution of a spectrum sensor is coupled to complexity (and cost) of its analog and computational components. Current sensor technology (with respect to time resolution) includes: (1) high-time resolution spectrum capture systems that have an ability to continuously sample several gigahertz (GHz) of radio frequency (RF) bandwidth, and (2) low-resolution, inexpensive, narrow-bandwidth (~50 MHz) software-defined radios, such as the Universal Software Radio Peripheral (USRP) or HackRF. The first ones are complex and expensive because of their high-speed (2-5 Gsps) analog-to-digital converters (ADCs) and their need for computational power to perform real-time signal processing on those samples (e.g., graphics processing units (GPUs), field-programmable gate arrays (FPGAs), spectrum analyzers, etc.). The SDRs can be intelligently tuned to bands when a transmission is likely, their narrow bandwidth, and down-time during tuning, prevents SDRs from observing high-resolution temporal dynamics of the spectrum as well as insufficient frequency coverage.

The current subject matter system provides a solution to the existing systems by providing a spectrum sensor architecture that is capable of fine-grained time resolution (and is inexpensive). The spectrum sensing architecture may be configured to include (1) spectrum sensors that may be configured to rapidly sweep their center frequency across the entire spectrum, and may be configured to execute (2) signal processing algorithms that "unsweep" samples so that standard signal analysis may be applied (e.g., transmitter type classification). The current subject matter system, instead of tuning into each frequency, sampling for a short time, then switching to the next frequency, rapidly sweeps across the entire spectrum.

FIG. 1 illustrates a comparison between time-frequency plots 102 and 104 corresponding to conventional tuning and capture systems and current subject matter's system, respectively. As illustrated by the plot 104, the current subject matter system is capable of capturing one or more portions of signals 115 in every frequency band by performing sweep sampling 113. By comparison, conventional systems performing sampling 103(*a, b, c*) only at certain times/frequencies, and thus are only able to capture specific portions of signals 105*a* and 105*b*, whereas other portions of signals 107 are entirely missed.

Figure 2A:
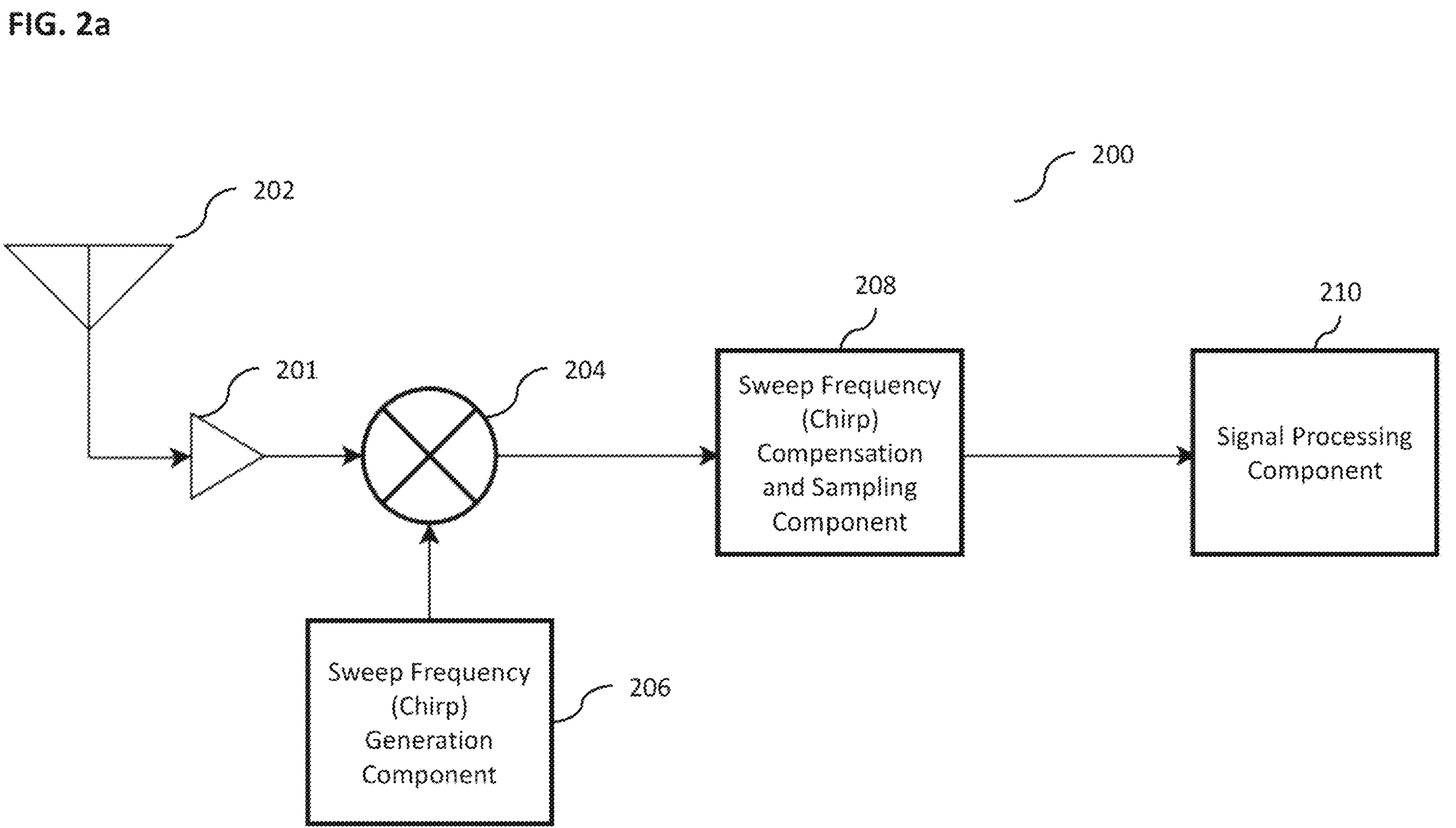
FIG. 2*a* illustrates an exemplary system for performing direct chirp/sweep-sampling of signals, according to some implementations of the current subject matter.

FIG. 2*a* illustrates an exemplary system 200 for performing direct chirp/sweep-sampling of signals, according to some implementations of the current subject matter. The system 200 may be configured to implement one or more components/functionalities of a software-defined radios. The system 200 may be configured to use SDRs to perform sweeping of a center frequency of an SDR by disconnecting a feedback loop used to tune the receiver's local oscillator and replacing it with a sawtooth waveform generated by the SDR's onboard digital-to-analog converter. Moreover, the system 200 may be configured to execute "unsweeping" of the swept samples. This may be accomplished using a self-calibration mechanism based on inverting effects of the sweep with a calibration signal received, for example, through a leakage from a SDR's own RF frontend. The system may be configured to multiply swept samples with the complex conjugate of calibration samples, thereby correcting the swept samples to make them appear as if they were collected at a single known center frequency. Moreover, the system 200 may be configured to evaluate a quality of swept samples.

As shown in FIG. 2*a*, the system 200, which may be configured as a receiver, may include an antenna 202, a frequency mixer or multiplier component 204, a sweep frequency (chirp) generation component 206, a sweep frequency (chirp) compensation and sampling component 208, and a signal processing component 210. The antenna 202 may be configured to be communicatively coupled to and transmit received signals to the mixer component 204. The component 204 may be configured to receive a sweep frequency (chirp) signal generated by the sweep frequency generation component 206. The mixer component 204 may be configured to then provide signals to the sweep frequency (chirp) compensation and sampling component 208 for later processing by the signal processing component 210. In some implementations, the component 206 may be configured as a local oscillator (LO). Use of the LO may be configured to allow system 200, may be configured to allow modified SDR receivers (e.g., system 200) to rapidly sweep across several GHz.

Figure 2B:
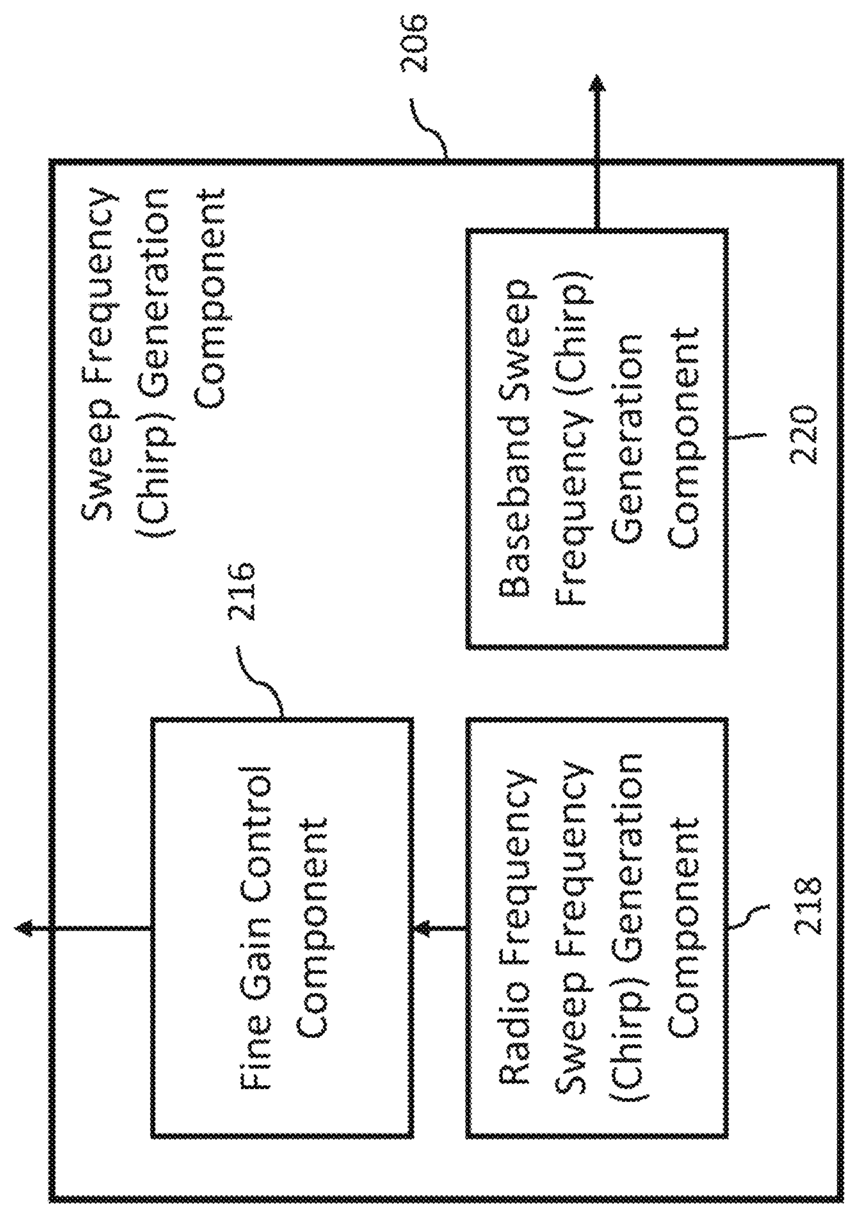
FIG. 2*b* illustrates an exemplary sweep frequency (chirp) generation component, according to some implementations of the current subject matter.

FIG. 2*b* illustrates an exemplary sweep frequency (chirp) generation component 206, according to some implementations of the current subject matter. The component 206 may be configured to be implemented using hardware, software, and/or any combination thereof. The component 206 may include a radio frequency sweep frequency (chirp) generation component 218, a fine gain control 216, and a baseband sweep frequency (chirp) generation component 220. The sweep frequency (chirp) generated by the component 206 may be provided to the mixer component 204.

Figure 2C:
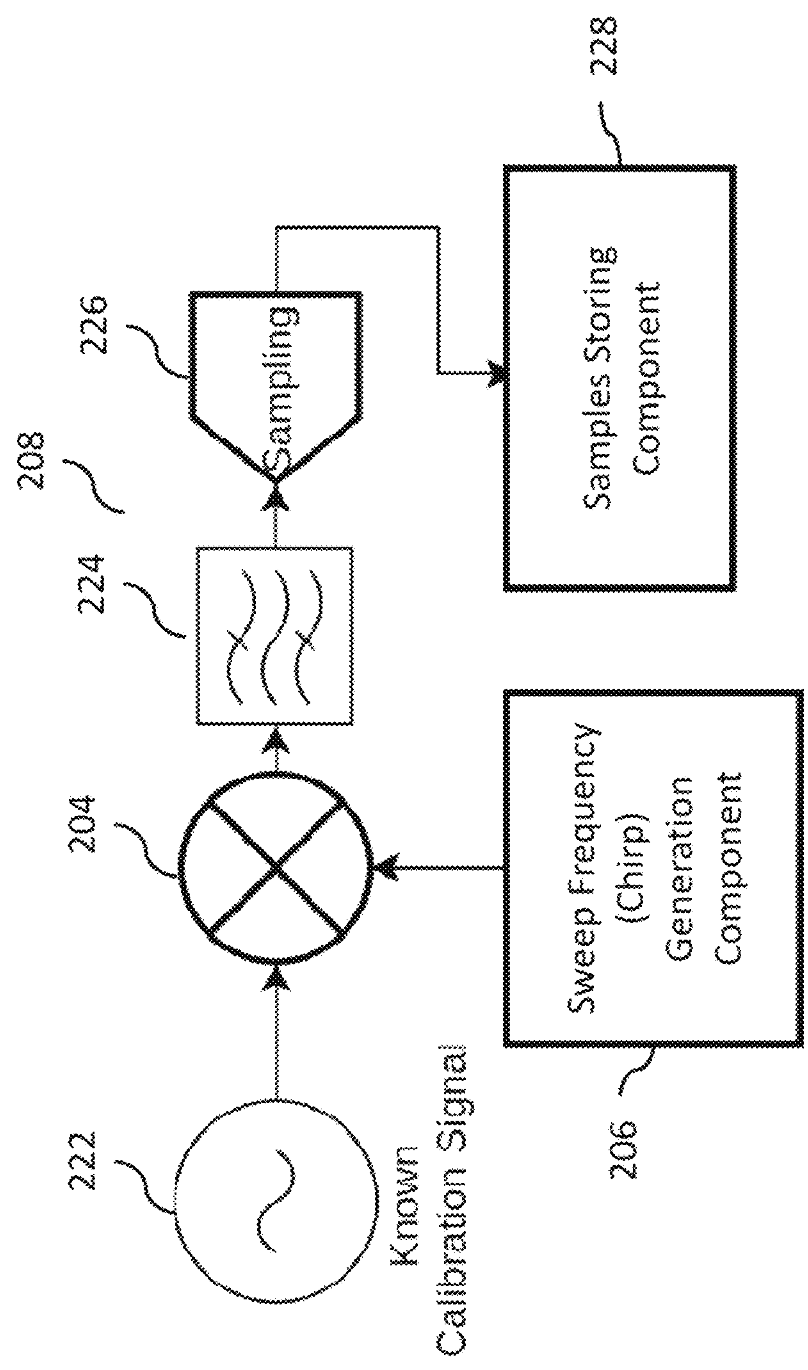
FIGS. 2*c-d* illustrate an exemplary operation of the sweep frequency (chirp) compensation and sampling component, according to some implementations of the current subject matter.
Figure 2D:
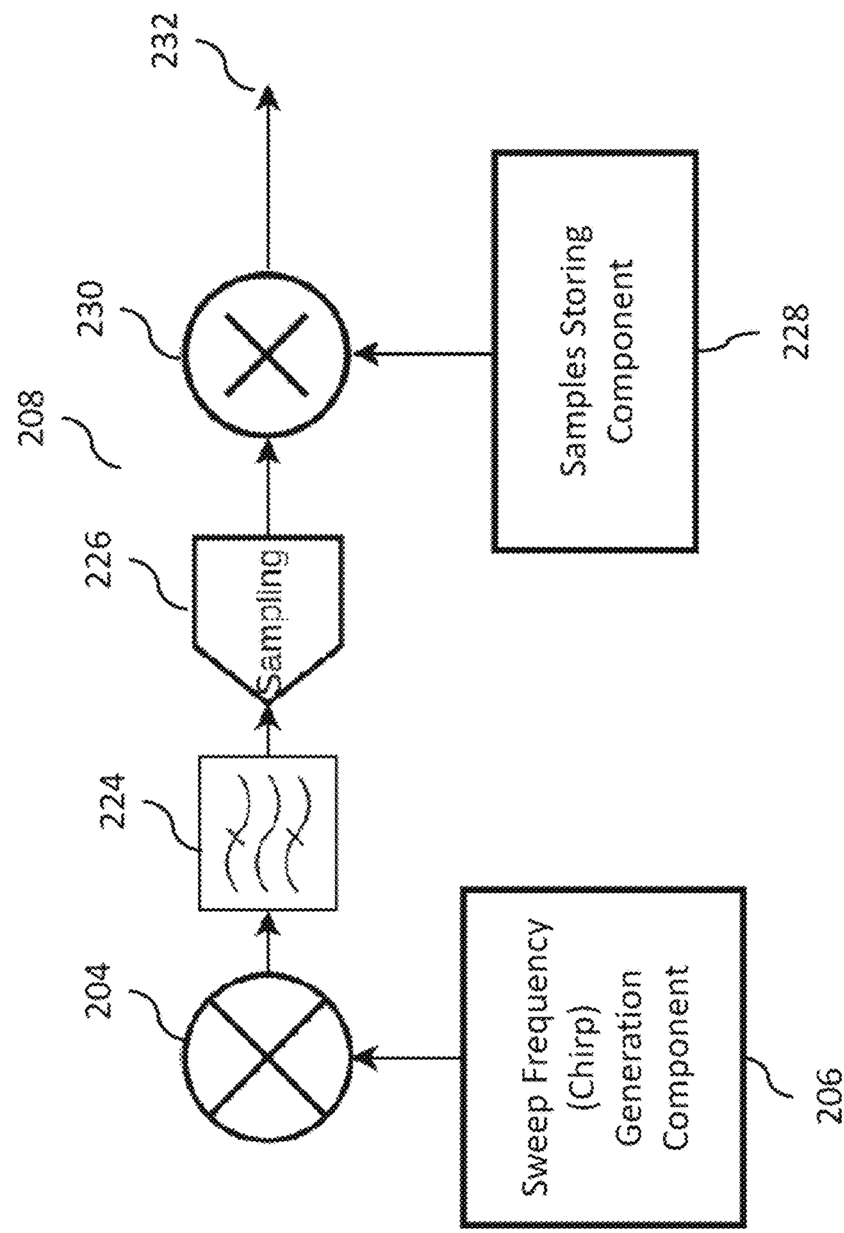

FIGS. 2*c-d* illustrate an exemplary operation of the sweep frequency (chirp) compensation and sampling component 208, according to some implementations of the current subject matter. In particular, the component 208, as shown in FIGS. 2*c-d* is shown in its exemplary digital implementation. To perform digital sweep frequency (chirp) compensation and sampling, the component 208 may be configured to receive a known calibration signal 222 (as will be discussed below). The calibration signal 222 may be received by the mixer component 204, which may also be configured to receive generated sweep frequency (chirp) from the component 206. The signals may then be provided to a filter component 224 and then sampled by a sampling component 226. The generated samples may be stored by the storage component 228. In some implementations, as shown in FIG. 2*d*, the stored samples that may have been stored by the storage component 228 may be provided to another digital mixing process component 230 for output 232 to perform chirp unsweeping/compensation during digital signal processing.

Figure 2E:
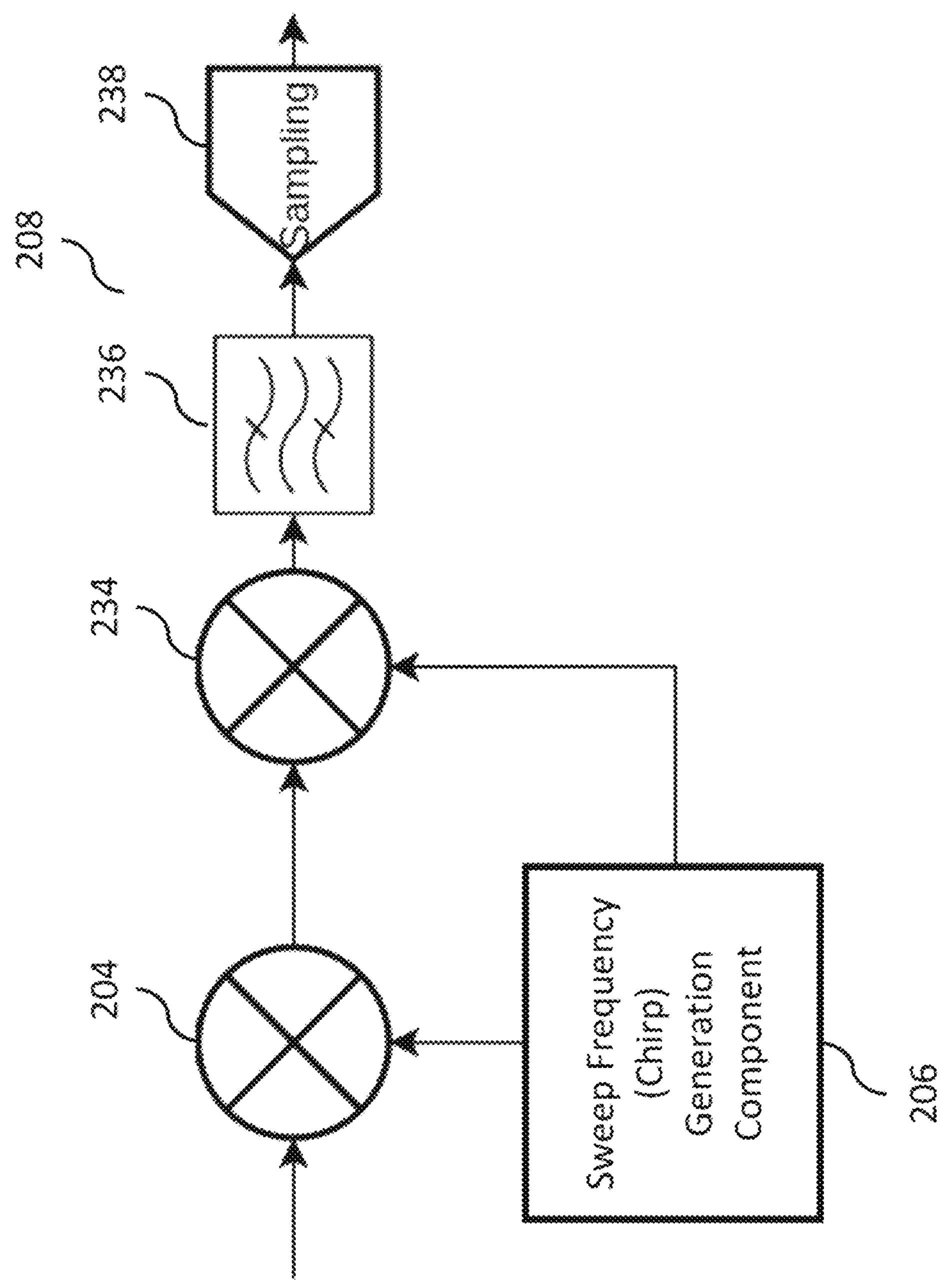
FIG. 2*e* illustrates another exemplary operation of the sweep frequency (chirp) compensation and sampling component, according to some implementations of the current subject matter.

FIG. 2*e* illustrates another exemplary operation of the sweep frequency (chirp) compensation and sampling component 208, according to some implementations of the current subject matter. Specifically, FIG. 2*e* illustrates an analog operation of the component 208. As shown in FIG. 2*e*, the component may be configured to include a mixer or multiplier 234, which may receive signals from the mixer component 204 as well as the sweep frequency (chirp) generation component 206. The multiplied signals may then be provided to the filter component 236, and then sampled by the sampling component 238.

In some implementations, the current subject matter's chirp/sweep sampling architecture may be used (e.g., as an auxiliary device) in various infrastructure base-stations (e.g., LTE, GSM, 5G, WiFi, etc.). The architecture may be used, for example, to assess spectrum occupancy, aid spectrum sharing, aid multiple access, gather data for control and/or management plane decisions, improve spectrum utilization, enforce spectrum regulations set by competent authorities, gather data for research purposes, etc. Further, chirp/sweep-sampling may be integrated into existing radios of these base-stations and/or be available as an independent external module.

In further exemplary implementations, the current subject matter's chirp/sweep sampling architecture may be used (e.g., as an auxiliary device) in handheld/user radios (e.g., smartphones, laptop computers, tablet devices, vehicles, etc.). In this case, the architecture may be used, for example, to gather usage information, for aiding spectrum sharing, for aiding multiple access, for detecting interferers, help enforce regulations, etc. Chirp/sweep-sampling may be integrated into existing radios of these base-stations and/or be available as an independent external module.

In yet further exemplary implementations, the current subject matter's chirp/sweep sampling architecture may be used as standalone deployment and/or as part of a sensor network. In these scenarios, the present architecture may be used, for example, to monitor spectrum usage in an area, evaluate the functioning and efficiency of wireless networks, aid in implementation of spectrum sharing, detect and locate spurious and legitimate transmissions of interest, enforce spectrum regulations, etc. Chirp/sweep sampling modules may be deployed individually, and/or in a networked manner over a wired/wireless network. As can be understood, other exemplary implementations and/or uses of the current subject matter's architecture are possible.

In some implementations, referring back to FIG. 2*a*, a local oscillator may be configured as a hardware component in an SDR that may generate a chirp signal which may allow tuning into a specific frequency. The tone from the local oscillator 206 may then be mixed with an amplified signal from the antenna 202 (e.g., amplified using component 201) to down-convert it to a baseband, where the signal may then be filtered and sampled by an analog-to-digital converter (ADC), which may be part of the component 208. The raw digital samples, that may be produced, may then be transferred to for processing by the signal processing component 210. The local oscillators 206 may be configured to generate chirp signals across a wide frequency range (e.g., similar to wideband frequency synthesizers). For instance, the MAX2870 frequency synthesizer on the USRP CBX RF frontend may generate a tone ranging from 23.5 MHz to 6 GHz.

Figure 2F:
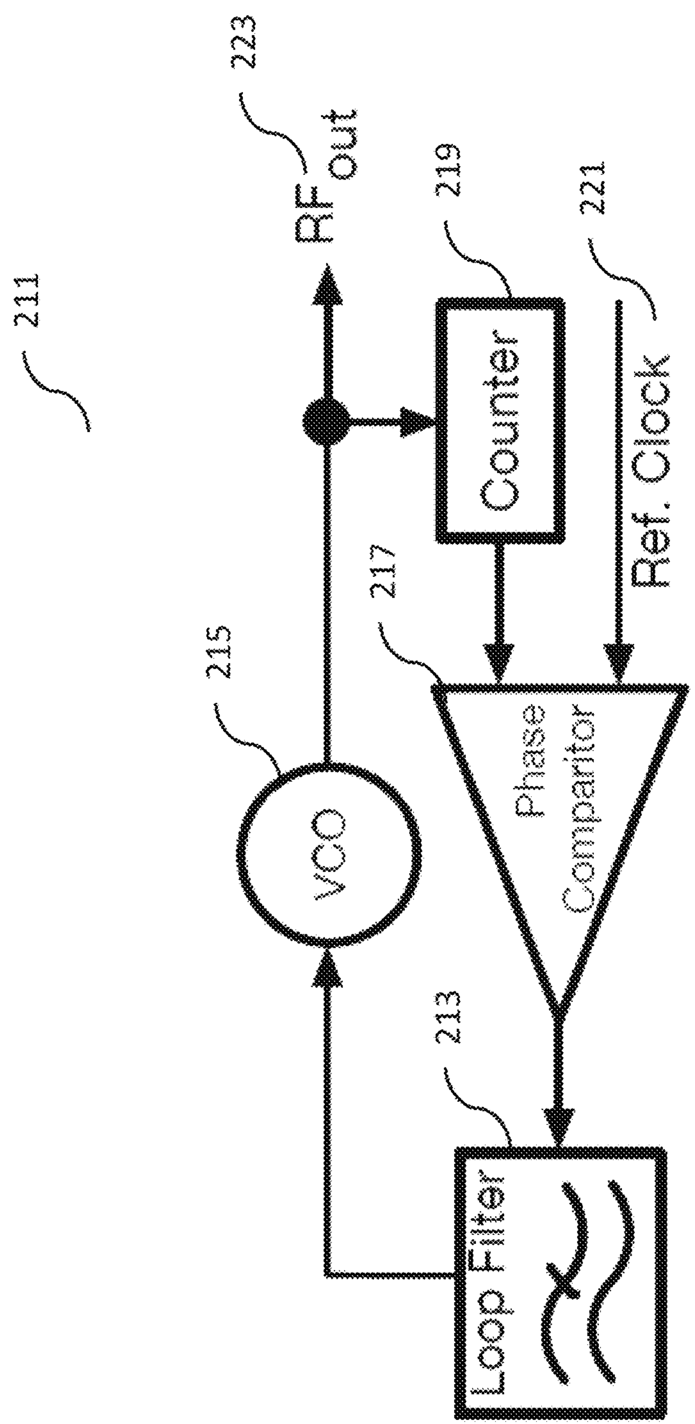
FIG. 2*f* illustrates an exemplary phase lock loop (PLL) component, according to some implementations of the current subject matter.

A wideband frequency synthesizer may be configured as a highly integrated phase lock loop (PLL) that may include circuitry necessary to generate a chirp signal at a predetermined frequency. FIG. 2*f* illustrates an exemplary phase lock loop (PLL) component 211, according to some implementations of the current subject matter. The PLL component 211 may include a low pass filter 213, a voltage controlled oscillator 215, a phase comparator 217, a digital counter 219, a reference clock 221, and a output (RF out) 223.

The PLL component 211 may be configured to operate as follows. First, the voltage controlled oscillator (VCO) 215 may generate a tone near a predetermined (e.g., requested) frequency. Then, a feedback loop may adjust a tuning voltage of the VCO 215 to lock it into the predetermined frequency as follows: the digital counter 219 may be set to a value that evenly divides the VCO's 215 output tone down to equal the frequency of a stable reference clock (e.g., a temperature compensated oscillator connected to the PLL). The phase comparator 217 may then perform an analog comparison between the phase of the divided-down output of the VCO 215 and the reference clock 221. This phase comparison signal is then filtered by the external low pass filter 213 (e.g., as may be implemented with passive components (e.g., an RC filter) called a "loop filter", whose cutoff frequency may determine how quickly and/or accurately the lock may be achieved). The filtered phase comparison signal is then fed back into the VCO 215 as its tuning voltage. The signal may bump up or down the VCO's output frequency to lock into the predetermined frequency.

Figure 2G:
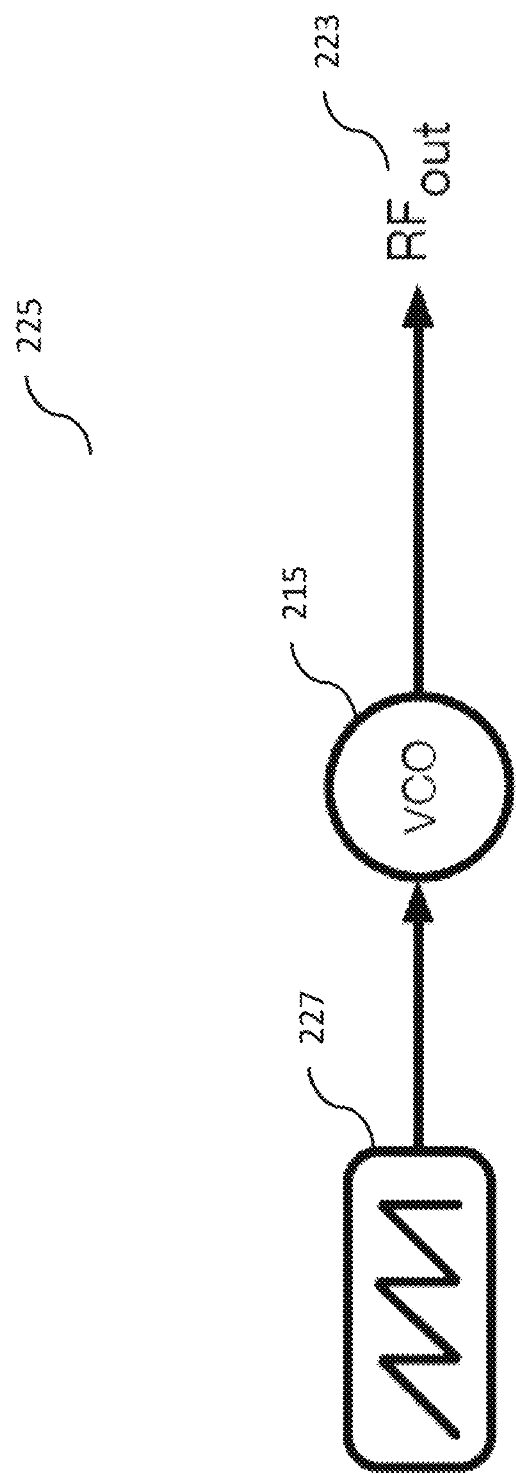
FIG. 2*g* illustrates an exemplary phase lock loop (PLL) component, according to some implementations of the current subject matter.

In some implementations, the PLL 211 may be configured to perform sweeping. The sweeping may be accomplished by the PLL 211 controlling its output frequency by manually adjusting the input voltage to the VCO 215, and/or by having a customizable loop filter 213 that may be implemented with external passive components. Moreover, the PLL 211 may be modified (as shown by the modified PLL configuration 225 in FIG. 2*g*) to sweep by disconnecting (e.g., by desoldering) loop filter components. This may effectively disconnect the feedback loop, and replace it, for example, with a saw-tooth waveform component 227 that may make the VCO 215 generate a chirp. Alternatively, or in addition to, one or more counter/divider values of the PLL 211 may be changed for the above purposes.

In some implementations, frequency synthesizers in SDRs may also be particularly suitable to sweeping for spectrum sensing because they may be configured using one or more VCOs, each of which may provide a narrow portion of the entire frequency range. VCOs may be implemented using a VCO cores (e.g., LC circuits), each of which may be configured to switch in a set of varactors (e.g., bands) depending on the desired frequency range). Further, using one or more VCOs, frequency may be swept linearly and non-linearly, whereby a control register may be provided for the purposes of selecting a VCO.

In some implementations, the current subject matter system may use samples captured using rapid sweep to enable applying protocol detection techniques. However, the rapid sweeping captured samples, which may be time-frequency distorted. Unlike band hopping-based spectrum sensing where the sensor is parked into a specific center frequency and samples are collected at that center frequency, system 200's center frequency may be monotonically increasing and thus, samples captured may have varying center frequency. Thus, rapid sweeping captured samples that have monotonically increasing center frequency (time distortion), with no label of center frequency for each sample (frequency distortion), may make it difficult to use for sensing purposes.

To solve this problem, the system may be configured to "unsweep" samples captured in each band. "Unsweeping" may create a view of the samples as if they were collected at a particular center frequency like band hopping. This makes it possible to directly apply existing energy and protocol detection techniques. Unsweeping may include calibration to determine a center frequency that was in use when the SDR collected each sample during the sweep. Further, unsweeping may include recovery to compensate for the effect of sweeping center frequency to produce samples that appear to have been collected with a stable center frequency.

The current subject matter system may be configured to determine a center frequency for each sample captured during the sweep, which then may then be used for sensing. However, sweeping the center frequency of the SDR receiver may produce samples that have monotonically increasing center frequency, as discussed above. The reason is that monotonically increasing center frequency may fed into the mixer (e.g., mixer 204), which may process air samples and multiply them with the monotonically increasing center frequency. The result of this multiplication is shifting the frequency of the over-the-air signal, which may then be filtered by low pass filter and sampled at fixed ADC sampling rate. Thus, captured samples may be devoid of any information about the center frequency of the air signal.

Figure 5:
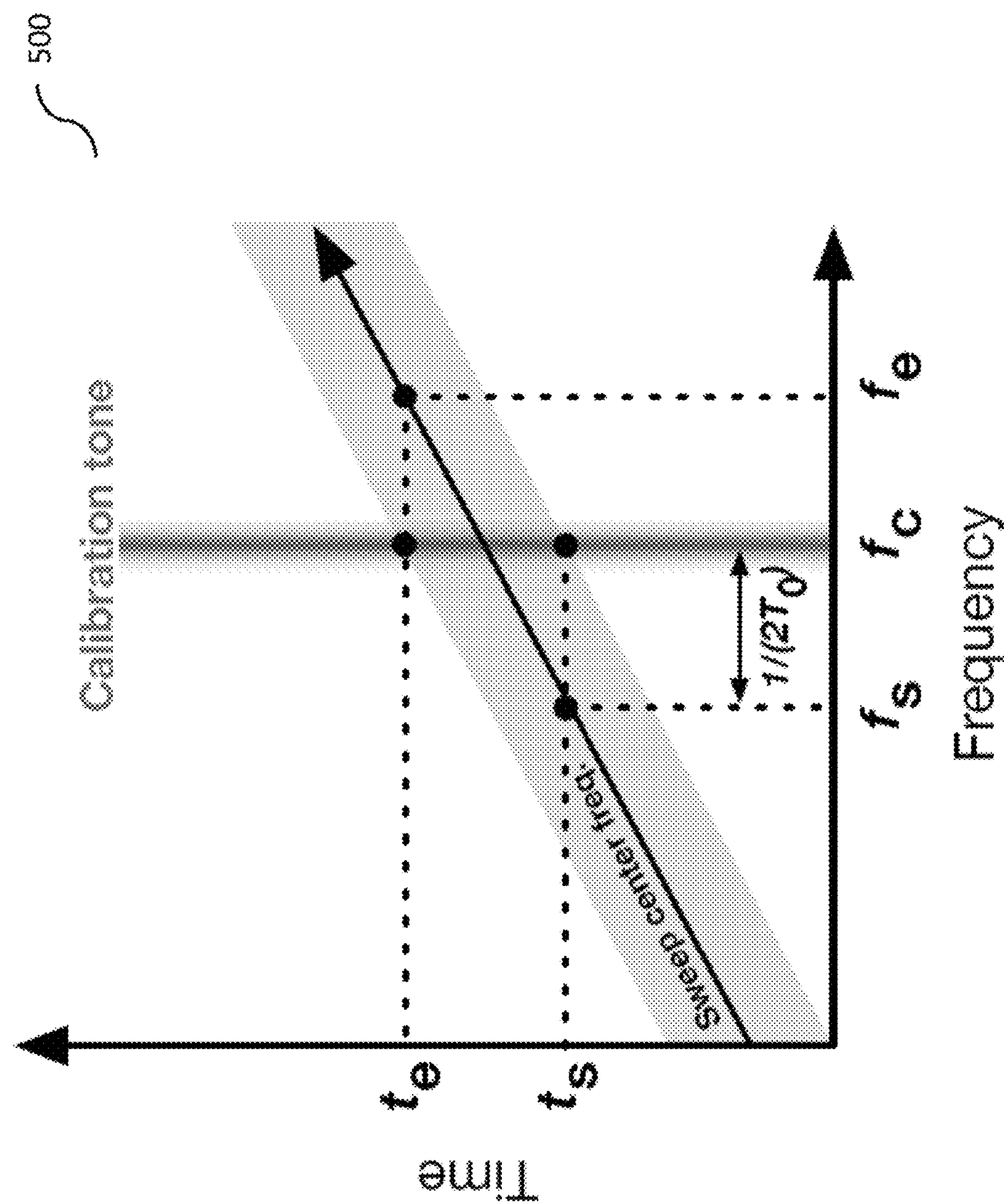
FIG. 5 illustrates a calibration plot, according to some implementations of the current subject matter.

In some implementations, the VCO may be calibrated by sweeping over a known reference tone frequency. For example, if a known reference frequency at each sample is received, the observed frequency at that sample may be measured, and used as the reference frequency to determine the actual center frequency for each sample. FIG. 5 illustrates a calibration plot 500, according to some implementations of the current subject matter. As shown in FIG. 5, at time $t_s$, a calibration tone may be observed at baseband on highest frequency $$\frac{1}{2T_0}$$

(where $T_0$ is the sampling rate). As time progresses, the calibration tone may be observed at a lower frequency in baseband and, at time $t_e$, it is now observed at $$-\frac{1}{2T_0}$$

and there on, it is no longer visible. The samples received by swept receiver may be a chirp for the calibration tone.

As is further shown in FIG. 5, the true center frequency at time $t_s$ is $f_s$, which is $$-\frac{1}{2T_0}$$

from the calibration zone. The value of $$\frac{1}{2T_0}$$

corresponds to the observed frequency at the baseband at time $t_s$. Thus, the true center frequency for each sample may correspond to the calibration tone subtracted by the observed frequency for that sample in the baseband. Similarly, at time $t_e$, the true center frequency $f_e$, is at $$+\frac{1}{2T_0}$$

from the calibration zone, where the observed frequency is in the baseband is $$-\frac{1}{2T_0}.$$

Further, using the observed frequency in the baseband and the calibration tone, the true center frequency for each sample may be thus be determined.

In some implementations, an SDR transmitter may be used to generate a known frequency (which may co-located with other components on the board). The transmitter VCO may include a phase locked intact to the reference clock, thus, it may be configured to generate a known reference tone, which may then be used to for calibration purposes.

In some implementations, once the relationship of each sample and its center frequency is defined, the current subject matter may be configured to perform sample compensation. To do so, the current system matter system may be configured to execute a recovery algorithm to translate samples such that tone looks like a tone, and not a chirp, which may allow execution of signal processing algorithms.

Figure 6:
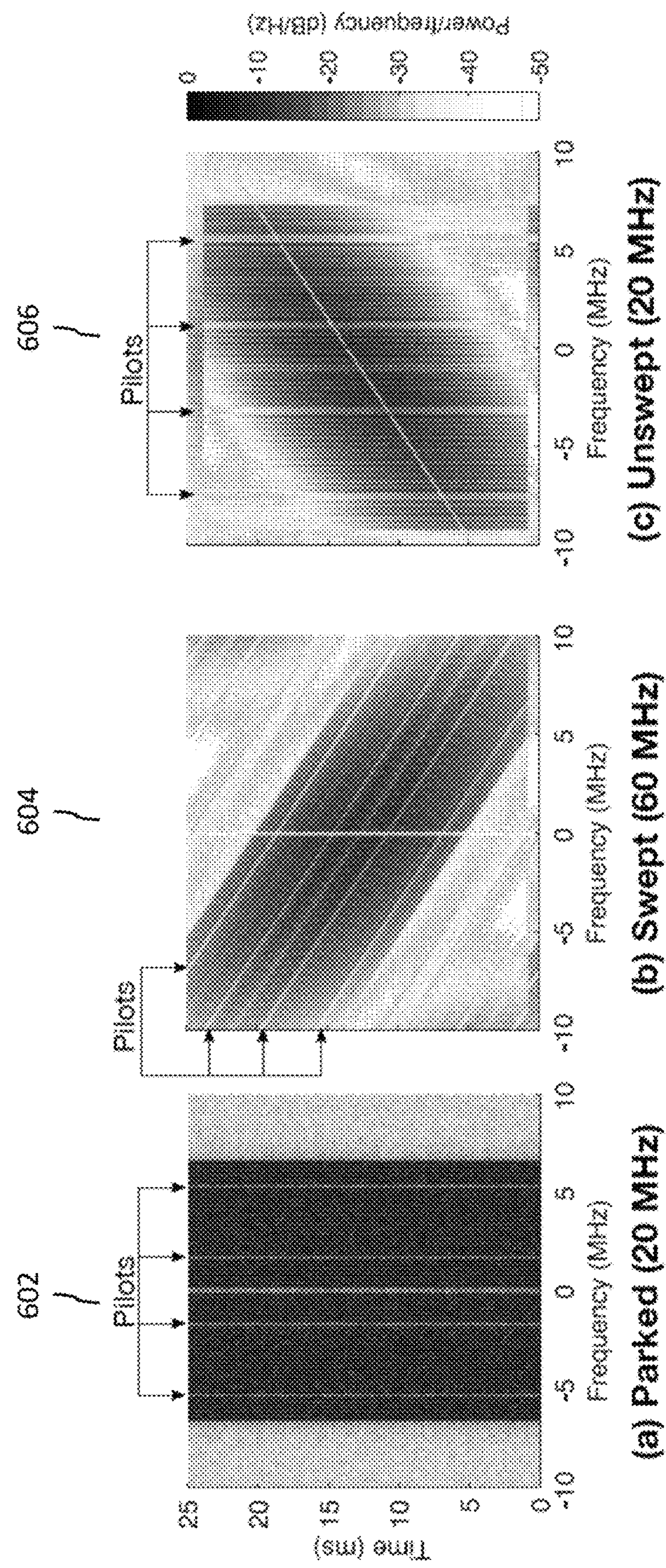
FIG. 6 illustrates exemplary spectrograms of samples captured for WiFi OFDM transmission.

FIG. 6 illustrates exemplary spectrograms 602 (shown in part (a) of FIG. 6), 604 (shown in part (b) of FIG. 6), and 606 (shown in part (c) of FIG. 6) of samples captured for WiFi OFDM transmission. Part (a) of FIG. 6 illustrates samples captured using a parked receiver; part (b) illustrates samples captured using a swept receiver; and part (c) illustrates samples captured current subject matter's technique. For example, the plot 604 of the captured OFDM data on channel 1 using chirp based LO, compared with the standard captures on plot 602 (by way of a non-limiting example, the plots in FIG. 6 are illustrated for capturing WiFi OFDM transmission 20 MHz bandwidth at channel 1 on 2.4 GHz with a chirp rate of 100 MHz in 100 μs with ADC sampling rate of 20 MHz). The received spectrogram in plot 604 is not near to OFDM, and instead of park and capture where the OFDM, with 4 pilots, are observed. In sweep and capture, each sample captured has changing carrier frequency offset, which means that each subcarrier data is mixed with other sub-carriers due to changing carrier frequency offset.

Referring back to FIG. 5, the current subject matter system may be configured to resolve the problems shown in parts (a) and (b) of FIG. 6, by transforming swept signal back to the signal captured using park and capture at a center frequency. For example, as shown in FIG. 6, at time $t_s$, the captured sample may have a positive frequency $$\frac{1}{2T_0},$$

but if the frequency is shifted by $$-\frac{1}{2T_0},$$

it brings it back to a DC tone. Similarly, at time $t_e$, the observed frequency in the baseband is $$\frac{1}{2T_0},$$

and if the frequency is shifted $$+\frac{1}{2T_0},$$

it brings it back to the DC tone. This corresponds to application of a negative of the observed frequency in baseband, i.e., a multiplication by a conjugate in the time domain.

Subsequent to identifying the center frequency of SDR for each sample captured during the rapid sweep and compensated the samples to recover un-swept samples, which was accomplished by a fast spectrum analyzer that can report power captured over the entire spectrum in a short period of time (e.g., 5 milliseconds), diversity of protocol may be detected using the corrected samples. That is, the signal types of protocol on the entire spectrum may be detected, regardless of the wireless communication protocol on a chunk of the spectrum (e.g., WiFi-OFDM, LTE-OFDM, DSSS, Zigbee, Bluetooth, and/or the like).

In some implementations, the current subject matter system, given compensated rapid sweep samples, may be configured to apply a park and capture technique to detect or infer protocol. Typically, park and capture spectrum sensors may use demodulation and decoding to detect diversity of protocol. However, even after compensation of the rapid sweep samples, traditional decoding of the packets might not be possible. To perform decoding and demodulation, the current subject matter system may be configured to capture a preamble of the protocol. The present system may be configured to use a short number of samples for any frequency band while the samples are noisy, and infer the protocol. Some implementations of the current subject matter may implement use of a cyclo-stationarity analysis to detect of protocol.

As part of the cyclo-stationary analysis, it may be assumed that signals may have patterns, whereby some patterns may be repeated in time and frequency. Even for most high-data rate modulation scheme, such as WiFi-OFDM, may also have a repeating pattern in both time and frequency. In time domain, WiFi-OFDM has the 0.8 μsec of cyclic prefix, those are samples copied from the end of every symbol to the start of the symbol, to resolve inter-symbol interference in OFDM communication systems. Further, WiFi-OFDM may also have patterns in the frequency domain. Every WiFi-OFDM symbol may have four pilots and their values may be repeated in a fixed pattern. Hence, in WiFi-OFDM, the most complex modulation may have patterns in both time and frequency. The patterns might not be limited to WiFi-OFDM, but may universally exist for all signals. Thus, there may exist patterns in all the protocol communication protocol. Cyclo-stationary analysis may provide tools to capture repeated patterns in time domain, and frequency domain. These patterns may be calculated by shifting the frequency and correlating the received with itself. Assuming x[n] is the received signals the cross ambiguity function (CAF) may be determined as follows (which captures time domain patterns):

$$R_x^{\alpha}(\tau) = \sum_{n=-\infty}^{\infty} x[n][x^*[n-\tau]]e^{-j2\pi\alpha n}$$

where τ represents the autocorrelation delay, and α represents the pattern frequency. Similarly, spectral correlation density (SCD) may be determined as follows (which captures frequency domain patterns)

$$S_x^{\alpha}(f) = \frac{1}{L}\sum_{l=0}^{L-1} X_{lN}(f)X_{LN}^*(f-\alpha)$$

Figures 7A, 7B:
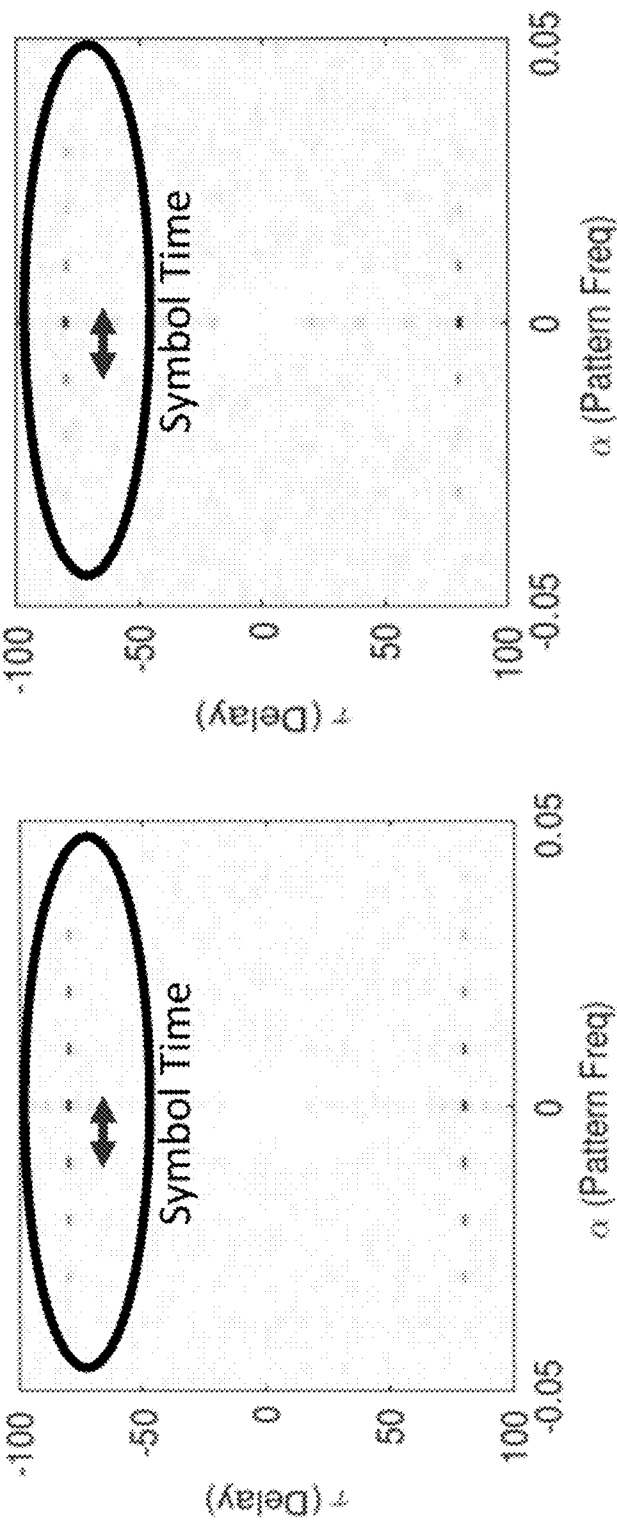
FIGS. 7*a-b* show CAF plots for park and captured samples (FIG. 7*a*) and compensated swept samples (FIG. 7*b*)

FIG. 7a illustrates an exemplary plot 702 of CAF for WiFi-OFDM. As can be seen from FIG. 7a, the CAF shows an autocorrelation of 80 samples (equivalent to 64 samples at 20 MSps) in time domain. SCD also has four weak lines in the diamond and/or exhibits high magnitude, presenting the existence of correlations in frequency. The former is a result of correlation in time due to OFDM cyclic prefix, while the latter is caused due to repetition of pilots in frequency domain.

In some implementations, for the purposes of detection of protocol, the current subject matter's system does not need an entire packet to extract a time and frequency pattern. If there are multiple symbols of any protocol, then the repeated patterns may be obseserved in those multiple symbols. Upon performing autocorrelation (e.g., using cyclic autocorrelation function), whenever an amount of delay is equal to the repetition time, the correlation would be high, thereby retaining the CAF properties. Similar argument may be applicable to SCD. Thus, CAF and SCD on short amount of sample may also have patterns, which may be used to infer and/or detect the protocol. The above observation may be approximated using a rectangular windowing function applied to entire packet capture. The implication of the rectangular window on CAF is that it is multiplied by same rectangular window functions since it calculates the time domain correlation function. The implication of the rectangular window to SCD is convolution with sinc function which would spread the peaks in SCD, however peaks would still be present to infer the protocol.

In some implementations, patterns may be extracted from phase noise riddled samples, as compensated noisy samples may be immune to extraction of CAF and SCD patterns. This is because CAF and SCD may be calculated by performing moving window averaging over the captured samples, thus, CAF and SCD may be averaged quantities. Because of the averaging effect, the noise of the noisy samples may be reduced. To verify the above using the current subject matter system, an OFDM waveform was transmitted and the OFDM was received using rapid chirp receiver. The received samples were then compensated, and, CAF and SCD were calculated on those samples. Further, to compare that SCD and CAF are un-affected, same OFDM was captured using parked receiver architecture. FIGS. 7a-b show CAF plots for park and captured samples (plot 702 shown in FIG. 7a) and compensated swept samples (plot 704 shown in FIG. 7b), where there is almost no difference. Hence, the current subject matter system may use cyclo-stationarity analysis to detect protocols even with noisy samples, as long as there are multiple symbols.

Exemplary Experimental Setup

To illustrate operation, the current subject matter system was setup using a standard off-the-shelf USRP N210 as an SDR platform. A LO sweeping modification was implemented as discussed above on both the CBX daughter card which supports 1.2 GHz to 6 GHz and SBX daughter card which supports 400 MHz to 4.4 GHz. An FPGA code was written for the frequency planning which controls the VCO band schedule, as is also discussed above. The register values were modified to achieve an arbitrary frequency planning as needed. The RF front-end is connected to a switch which has 4 antennas connected to provide coverage for entire 6 GHz, the switch are configured by the FPGA board depending upon frequency used for sweeping. The host personal computer (PC) uses 10 GigE Ethernet card to connect with the USRP. The host PC ran python based GNUradio to capture the samples at 25 Msps and also set the registers which control the frequency planning. The captured samples were streamed to the PC and stored on the PC and are processed offline in MATLAB for signal inference.

For implementing the calibration, a tone of known frequency was transmitted from the transmitter chain of the USRP, where the PLL was intact and received it with the same USRP, which provided the known reference frequency signal. The receiver of the USRP was modified to enable sweeper behavior. The T/R switch on the TX/RX of USRP had 30 dB isolation, thus, the transmit signal leaked over to the modified receiver 4. This process was repeated with different tones until calibration data was obtained for all the frequencies of interest. During the above process, the ramp generated by the DAC on the USRP was time-synchronized with the ADC samples captured. After calibration data was obtained, the data was used for all further evaluations in similar settings, without the need to redo the calibration process. This process was performed by the in-built transmit chain in the current subject matter' system.

During experiments, it was observed that classification may be on very small amount of partial packet or symbols, which requires 25 usec to classify the signal types in contrast to full packet length of typically 1-10 msec, which is at least 40 times better. Based on the classification results, it was observed that while sweeping as fast as 100 usec per 100 MHz, the current subject matter system also captured dynamics. A standard USRP with CBX daughterboard take 100 usec to tune to a frequency and is capturing 25 MHz of bandwidth it would need to hop 4 times to cover 100 MHz, and assuming it can use the above classification algorithm, it would need to spend 25 usec on each band, in total, requiring 500 usec to sweep 100 MHz using tune and capture, which 5 times slower than the current subject matter's system.

II. Superheterodyne Chirp Sweep Sampling Down-Conversion Architecture

In some implementations, the current subject matter may be configured to provide a superheterodyne chirp sweep-sampling down-conversion architecture. In particular, such architecture may be configured to achieve a high dynamic range spectrum sensing over a wide bandwidth at high-speed. The sweep-frequency architecture may be combined with a superheterodyne receiver to create a solution that has higher signal selectivity. By modulating the superheterodyne local oscillator's (LO) power, the current subject matter may be configured to provide a frequency selective gain control. Since the sweep-frequency architecture observes entire bandwidth in a monotonic fashion, the current subject matter system may provide a gain forecasting system that may measure signal power in upcoming bands. The gain forecasting system may provide feedback to gain control algorithm, allowing current subject matter system to adapt quickly to changes in signal power.

In some implementations, as stated above, the current subject matter system may combine a super-heterodyne (superhet) architecture with sweep-sampling and a gain control mechanism to enable high dynamic range sensing even in a congested spectrum. Superhet architectures may be used to improve signal selectivity in a variety of applications such as measurement equipment, high-sensitivity receivers, etc. Combining sweep-sampling with superhet architecture may augment its wide bandwidth, high speed sensing capability with superior dynamic range performance. A sweep-frequency local oscillator may be used in the RF superhet stage to convert RF signals to a fixed IF frequency.

Similar to the discussion above, a sweep-frequency local oscillator may be used to down-convert RF signals to a fixed intermediate frequency (IF). A radio may then be used to bring the IF signal to baseband and subsequently sample it for analysis. A sharp bandpass filter at the IF stage may be used to cut out all signals which are outside of the sampling bandwidth of the radio. The RF frequency that is down-converted and is visible at the output of the IF filter may be determined by the frequency of the LO. Since the LO sweeps, the RF frequency visible at the IF may also have a sweeping nature. The sweep-frequency LO generation may be performed using a conventional phase-locked transmit chain, thereby inheriting a stability and low-noise aspects of a phase-locked loop (PLL). This architecture may be include a much wider IF filter than conventional sweep-frequency architectures such as the one in spectrum analyzers and may perform sampling to allow for rich signal processing and inference. The current subject matter system takes advantage of the control over the generated LO power to fine-tune the gain on a frequency selective basis as the receiver sweeps across a large bandwidth. In contrast to existing variable-gain devices, which provide constant gain and take longer to settle, the current subject matter system may allow for seamless frequency-dependent gain control. The current subject matter system's gain forecast method may be used to control gain blocks in the chain to maximize dynamic range in the areas of interest.

Figure 3A:
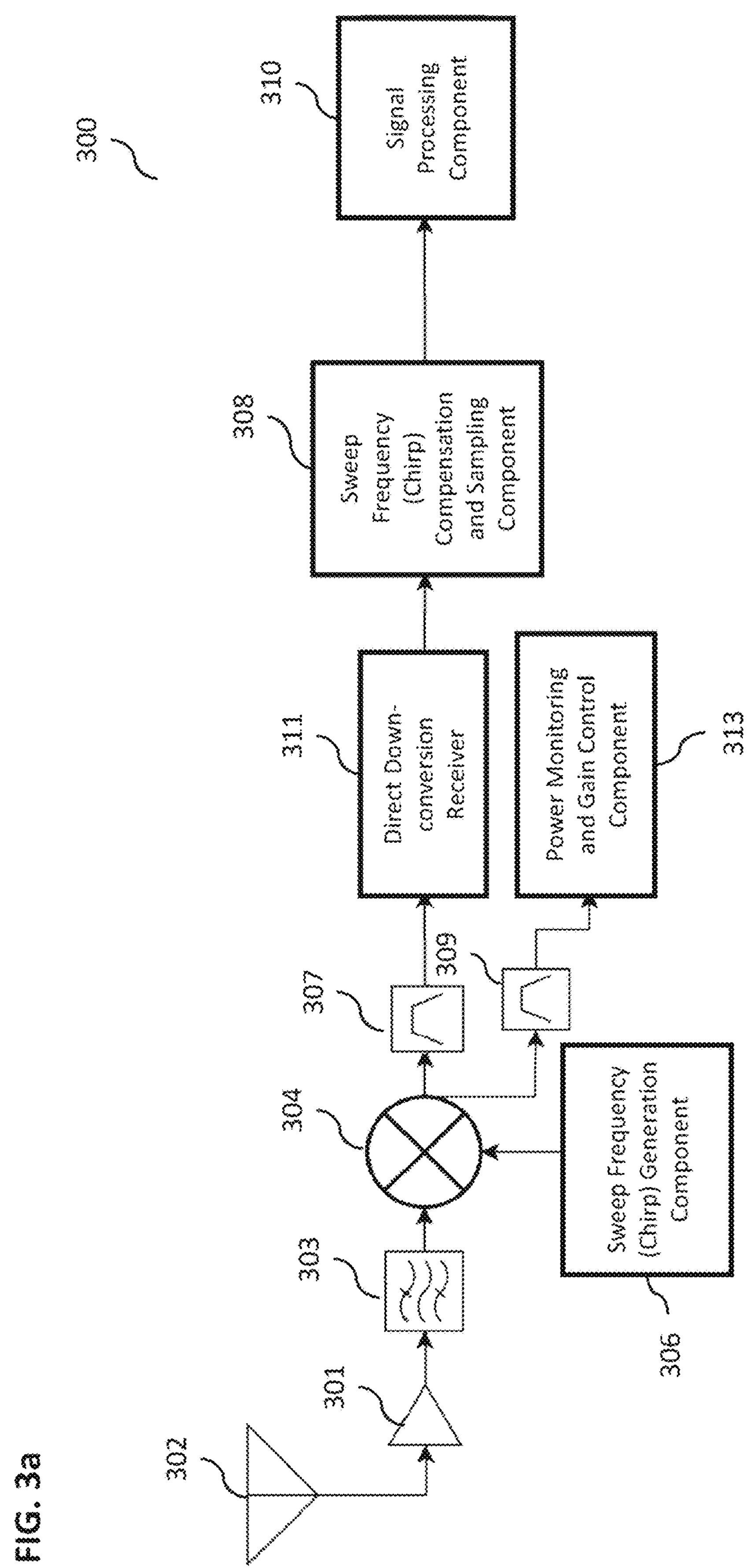
FIG. 3*a* illustrates exemplary superheterodyne architecture, according to some implementations of the current subject matter

FIGS. 3*a-d* illustrate exemplary superhet architecture 300, according to some implementations of the current subject matter. Referring to FIG. 3*a*, a superhet receiver may be configured to perform multiple mixing operations to analyze signals. In some exemplary implementations, a two stage receiver, with a fixed IF, may be used. The architecture 300 may be configured to provide higher sensitivity and better signal selectivity due to the multi-stage filtering effect and the ease of design of sharp signal and image reject filters in RF and typical IF frequencies.

As shown in FIG. 3*a*, the system 300 may include an antenna 302, an amplifier 301, a filter component 303, a frequency mixer or multiplier component 304, a sweep frequency (chirp) generation component 306, gain control components 307, 309, a direct down-conversion receiver 311, a power monitoring and gain control component 313, a sweep frequency (chirp) compensation and sampling component 308, and a signal processing component 310. The antenna 302 may be configured to be communicatively coupled to and transmit received signals to the mixer component 304 via amplifier 301 and filter 303. The component 304 may be configured to receive a sweep frequency (chirp) signal generated by the sweep frequency generation component 306. The mixer component 304 may be configured to then provide signals to the IF filter components 307 and 309, which are then provided to the receiver component 311 (or an IF device) and power monitoring and gain control component 313, respectively. The receiver component 311 processes the signal and transmits it to the sweep frequency (chirp) compensation and sampling component 308 for later processing by the signal processing component 310. In some implementations, the component 306 may be configured as a local oscillator (LO).

The system 300 may be configured to operate as follows. A first stage of the superhet receiver 300 may be driven by a chirp LO. The signal may then be processed by an IF bandpass filter (e.g., component 307) to the IF device (e.g., receiver 311) and subsequent sampling (by the component 308). A small amount of signal may be coupled through another IF filter (e.g., component 309) to the gain forecast component (e.g., component 313). The component 313 may be configured to execute a gain control algorithm.

In some implementations, the first stage of the superhet receiver architecture 300 may be used to down-convert RF signals using a sweep-frequency LO. This stage may be configured to be wideband (e.g., of the order of multiple GHz). Further, throughout the bandwidth of interest, the first stage may be designed to avoid image rejection issues. Image rejection is a metric that may be used to express relative power difference between the output of the desired input frequency to the output of its image. A simple solution to achieve high image rejection is to use quadrature (IQ) mixing, however, wide bandwidth IQ mixers may be difficult to implement due to RF matching considerations. To resolve this problem, the current subject matter may be configured to implement a passive wideband mixer during the first stage of operation of the architecture 300. Such mixers provide excellent linearity over a wide bandwidth. The conversion loss through the mixer may be offset using gain stages in the chain to achieve required sensitivity. To achieve image rejection, wide bandwidth switchable RF filters may be used to filter out frequencies that may interfere in the first stage mixing process, as shown in FIG. 3*a*.

A second stage of the operation of the superhet architecture 300 may include an IF filter 307 feeding a fixed-frequency IF receiver 311. The filter 307 may be a bandpass filter and may have a bandwidth equivalent to the IF receiver's bandwidth. The filter's roll-off may be sharp to effectively suppress out of band signals, where filter's roll-off directly may affect dynamic range that may be achieved by the system 300. The first stage LO's frequency may determine the RF frequency that mixes down to the fixed IF. Since the LO's frequency increases monotonically with time, the frequency of the portion of the band visible through the IF filter 307 may also increase monotonically with time. The sampling may be performed in baseband after the IF receiver 311 down-converts using a fixed frequency. The sweep-frequency LO of the first stage and the IF filter 307 effectively create a moving frequency window into the RF spectrum, implementing the sweep-sampling discussed in connection with FIGS. 2*a-g* above.

The first stage of the superhet system 300 and the IF filter 307 may also be bundled together into an external attachment to existing software defined radios, thereby allowing architecture 300 to be deployed easily with low cost and substantially no hardware modifications.

Figure 3B:
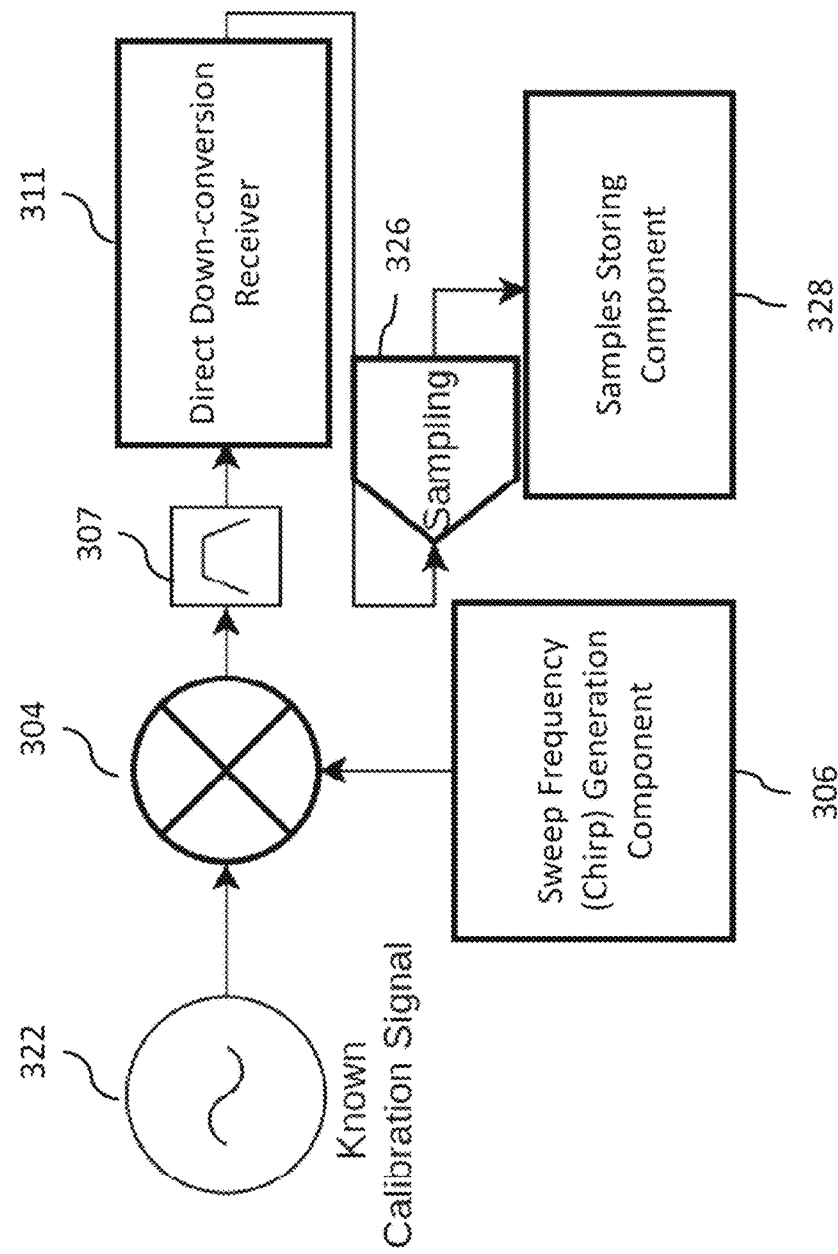
FIGS. 3*b-c* illustrate an exemplary operation of the second stage of the architecture shown in FIG. 3*a*, including compensation and sampling processes, according to some implementations of the current subject matter.
Figure 3C:
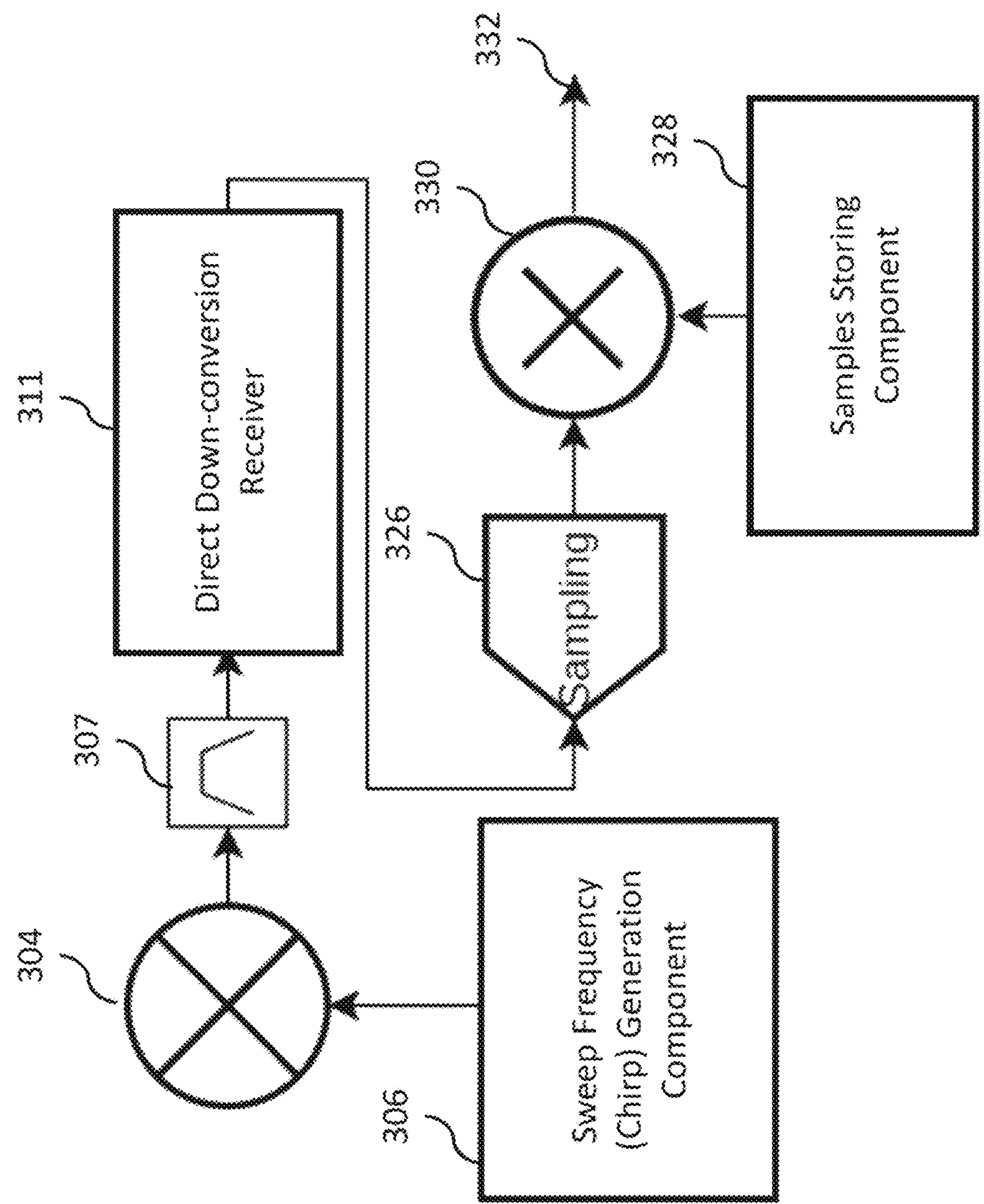

FIG. 3*b* illustrates an exemplary operation of the second stage of the architecture 300, according to some implementations of the current subject matter. In particular, FIG. 3*b* illustrates an exemplary digital implementation. To perform digital sweep frequency (chirp) compensation and sampling, a known calibration signal 322 may be received by the mixer component 304, which may also be configured to receive generated sweep frequency (chirp) from the component 306. The signals may then be provided to the IF filter component 307 and then to the IF device or receiver 311. The receiver 311 provides the processed signals to the sampling component 326. The generated samples may be stored by the storage component 328. In some implementations, the stored samples that may have been stored by the storage component 328 may be provided to another mixer 330 for output 332 (as shown in FIG. 3*c*) to the signal processing component 310 (as shown in FIG. 3*a*).

Figure 3D:
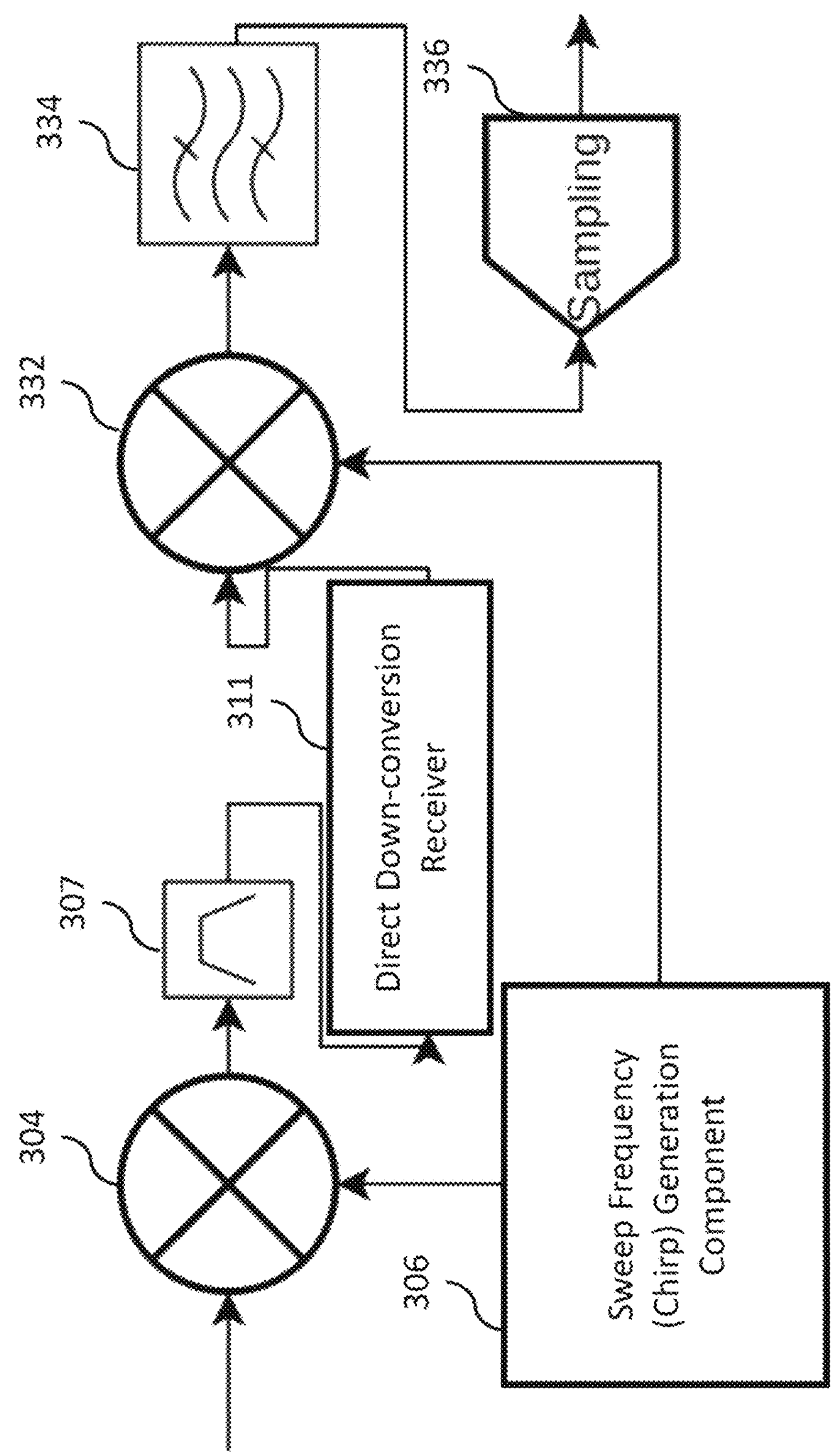
FIG. 3*d* illustrates exemplary analog operation of the sweep frequency (chirp) compensation and sampling component, according to some implementations of the current subject matter.

FIG. 3*d* illustrates exemplary analog operation of the sweep frequency (chirp) compensation and sampling component 308, according to some implementations of the current subject matter. As shown in FIG. 3*d*, a mixer or multiplier 334 may receive signals from the mixer component 304 as well as the sweep frequency (chirp) generation component 306. The multiplied signals may then be provided to the IF filter component 307 and then to the receiver component 311. The receiver 311 may provide the filtered signals to the mixer 332, which in turn, also receives signals from the sweep frequency (chirp) generation component 306 and provides multiplied signals to the filter component 334, which are then sampled by the sampling component 336.

Figure 4:
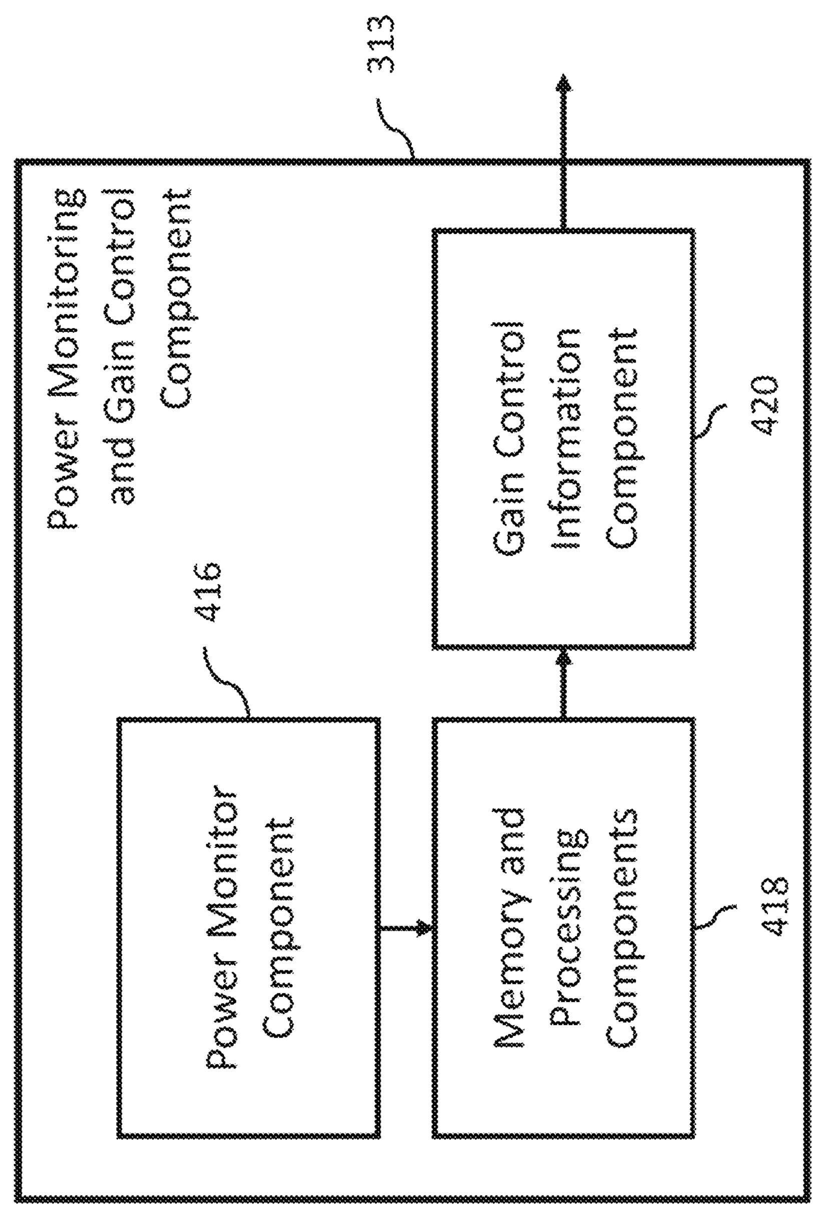
FIG. 4 illustrates an exemplary power monitoring and gain control component, according to some implementations of the current subject matter.

FIG. 4 illustrates an exemplary power monitoring and gain control component 313, according to some implementations of the current subject matter. The component 313 may be configured to be implemented using hardware, software, and/or any combination thereof. The component 313 may include a power monitor component 416, processor and memory components 418, which may be configured to output gain control information through component 420.

In some implementations, similar to the sweep-sampling architecture 200, the superhet architecture 300 may also be used (e.g., as an auxiliary device) in various infrastructure base-stations (e.g., LTE, GSM, 5G, WiFi, etc.). The architecture may be used, for example, to assess spectrum occupancy, aid spectrum sharing, aid multiple access, gather data for control and/or management plane decisions, improve spectrum utilization, enforce spectrum regulations set by competent authorities, gather data for research purposes, etc. Further, the architecture 300 may be integrated into existing radios of these base-stations and/or be available as an independent external module.

In further exemplary implementations, the superhet architecture 300 may also be used (e.g., as an auxiliary device) in handheld/user radios (e.g., smartphones, laptop computers, tablet devices, vehicles, etc.). The architecture 300 may be used, for example, to gather usage information, for aiding spectrum sharing, for aiding multiple access, for detecting interferers, help enforce regulations, etc. The architecture 300 may be integrated into existing radios of these base-stations and/or be available as an independent external module.

In yet further exemplary implementations, the architecture 300 may be used as standalone deployment and/or as part of a sensor network. In these scenarios, the present architecture may be used, for example, to monitor spectrum usage in an area, evaluate the functioning and efficiency of wireless networks, aid in implementation of spectrum sharing, detect and locate spurious and legitimate transmissions of interest, enforce spectrum regulations, etc. Chirp/sweep sampling modules may be deployed individually, and/or in a networked manner over a wired/wireless network. As can be understood, other exemplary implementations and/or uses of the architecture 300 are possible.

Referring FIGS. 3*a-d*, the architecture 300, using component 308, may be configured to perform sweep-sampling operation (as discussed above with regard to FIGS. 2*a-g*) by performing sweep-frequency LO generation and sweep-frequency compensation.

With respect to the sweep-frequency LO generation, it is noted that the quality of the generated LO may directly affect the quality of received samples and thus, the sensor's effectiveness. As discussed above, a low quality LO like that generated from an open loop VCO may degrade sensor performance and even introduce unpredictable time-varying offsets. The system 300 may be configured to implement a transmit chain to generate the sweep-frequency LO, where the chain's PLL frequency source may provide a distortion free LO frequency. In connection with sweep-frequency compensation, sweeping the LO frequency while down-converting may distort the original signals. The system 300 may be configured to remove distortion and allow sensing by using baseband samples of the transmitted LO to compensate for time-varying frequency offset introduced by sweep-frequency down-conversion. The sweep-frequency LO may allow architecture 300 to improve sensor dynamic range over the entire band of interest. To generate a sweep-frequency LO, the transmit chain may be fed with complex baseband samples that correspond to a monotonically increasing frequency chirp. The transmit chain may up-convert this baseband signal to the desired RF frequency. By controlling the frequency of up-conversion, the system 300 may selectively sweep different parts of the spectrum. Since the LO is digitally generated, the system 300 may exercise direct and exact control over sweep parameters such as sweep speed, bandwidth and center frequency. The LO power may also be digitally controlled at a sample-level. The sweep-frequency LO may bring RF signals to the fixed IF frequency where they may be down-converted using down-conversion receiver 311 and sampled in baseband. The sweep-frequency compensation may then be performed in post-processing by conjugate-multiplying the transmitted LO samples with the received baseband samples.

In some implementations, the system 300 may be configured to implement local oscillator power control as a gain mechanism. This may be particularly useful in situations where a high-power and low-power signal may be present together in adjacent frequency bands. This is quite common in familiar spectrum like LTE and 2.4 GHz ISM due to the large number of devices operating with different power levels. Increasing the system gain level to observe the weak signal may cause the stronger signal to saturate the chain or introduce nonlinear behavior. Thus, to reliably sense both signals and achieve have high dynamic range, there exists a need for frequency selective gain control. This selectivity will allow attenuation of the strong signals, while simultaneously amplification of the weak signals.

The current subject matter's sweep-frequency generation may allow full control over the LO generation. Existing passive mixers' conversion loss performance may depend directly on the power of the LO used, which may be used for a robust frequency-selective gain control scheme. While the frequency of the LO determines the frequency of signals in the RF spectrum that are visible to the IF stage, the power of the LO may be used to control attenuation experienced by these signals. If a frequency band has strong signals, the LO's power may be set to a lower value to deliberately attenuate the signals as they feed into the IF stage, protecting it from saturation effects.

If the same frequency band has both strong and weak signals, then the gain setting may apply for both the signals. Thus, a lower gain may be set to prevent the high power signal from saturating the receiver. In some implementations, any two signals separated in frequency may at some point be visible individually because of the sweeping nature of the LO. As discussed above, the IF filter may attenuate out of band signals heavily, effectively creating a sliding frequency window. This window may encounter one signal first, then the other. Similarly, the signal encountered first may move out of the window first and then the other. Thus, during the time when the weak signal is visible exclusively, the gain may be set to a high value, allowing its detection despite the strong signal's presence. Many existing high-sample rate spectrum sensors may be prone to saturation due to stray high-power interference since they sample the entire bandwidth at once. The current subject matter's system may handle any number and frequency location of strong interferers and may handle all possible scenarios. This technique provides independent control over the gain of the chain over the entire band of interest, with fine grained control achievable through the digital LO generation process.

In some implementations, the system 300 may be further configured to perform gain forecasting and control. In particular, the gain control scheme may be configured to implement a feedback mechanism. Conventional feedback mechanisms for gain control use a power detector to observe the in-band power and keep ramping up the gain till the input power reaches a specified operating threshold. In contrast to conventional systems, in some implementations, the system 300 may be configured to receive feedback of power on a frequency selective basis. Further, the system 300 may be configured to provide a sweep-frequency receiver architecture calls that may include a sweep-frequency gain feedback mechanism. In particular, a sweeping narrow-band power detector may be used to report frequency specific power across the entire spectrum. Instead of reporting power of the entire band at once, or of some smaller subset thereof, system 300's feedback mechanism may sweep across the entire band and report power as it sweeps.

In some implementations, frequency selection at the IF stage may be a function of the IF bandpass filter 307, as shown in FIG. 3*a*. Adding a parallel filter 309 may allow peering into bands that are not yet visited. The gain feedback may be implemented by tapping a small amount of signal right before the IF bandpass filter 307 and observing its power through a secondary power detect filter 309. By way of a non-limiting example, the power detect filter 309 may another bandpass filter selected to have a center frequency just higher the 3 dB bandwidth of the IF bandpass filter. The power at the output of the power detect filter 309 may be the power of signals in the band that will be shortly visible to the IF device. This power provides reliable forecast of the gain value should be set when system 300 arrives in that band. System 300 may use power forecasts along with historical measurements to decide on the gain setting based on an exponentially weighted scheme.

Figure 8:
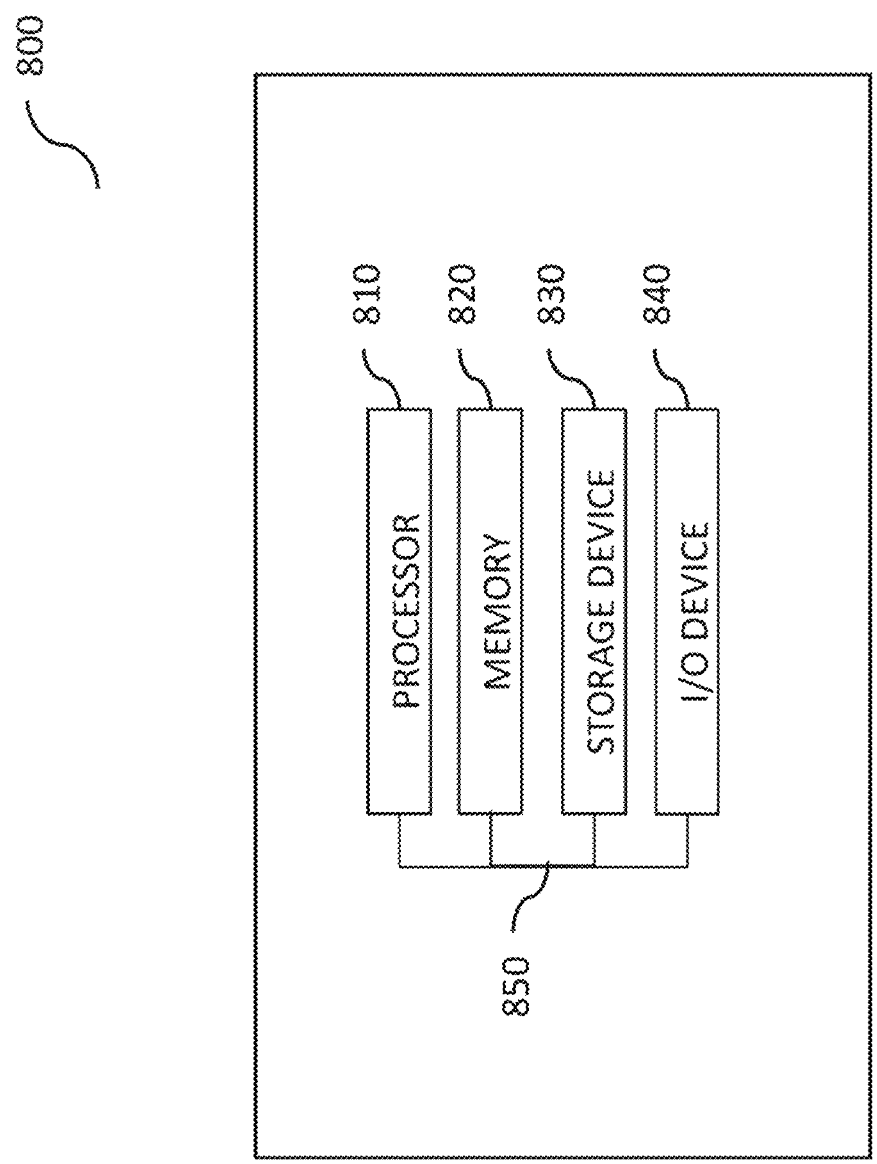
FIG. 8 illustrates an exemplary system, according to some implementations of the current subject matter.

In some implementations, the current subject matter can be configured to be implemented in a system 800, as shown in FIG. 8. The system 800 can include a processor 810, a memory 820, a storage device 830, and an input/output device 840. Each of the components 810, 820, 830 and 840 can be interconnected using a system bus 850. The processor 810 can be configured to process instructions for execution within the system 800. In some implementations, the processor 810 can be a single-threaded processor. In alternate implementations, the processor 810 can be a multi-threaded processor. The processor 810 can be further configured to process instructions stored in the memory 820 or on the storage device 830, including receiving or sending information through the input/output device 840. The memory 820 can store information within the system 800. In some implementations, the memory 820 can be a computer-readable medium. In alternate implementations, the memory 820 can be a volatile memory unit. In yet some implementations, the memory 820 can be a non-volatile memory unit. The storage device 830 can be capable of providing mass storage for the system 800. In some implementations, the storage device 830 can be a computer-readable medium. In alternate implementations, the storage device 830 can be a floppy disk device, a hard disk device, an optical disk device, a tape device, non-volatile solid state memory, or any other type of storage device. The input/output device 840 can be configured to provide input/output operations for the system 800. In some implementations, the input/output device 840 can include a keyboard and/or pointing device. In alternate implementations, the input/output device 840 can include a display unit for displaying graphical user interfaces.

Figure 9:
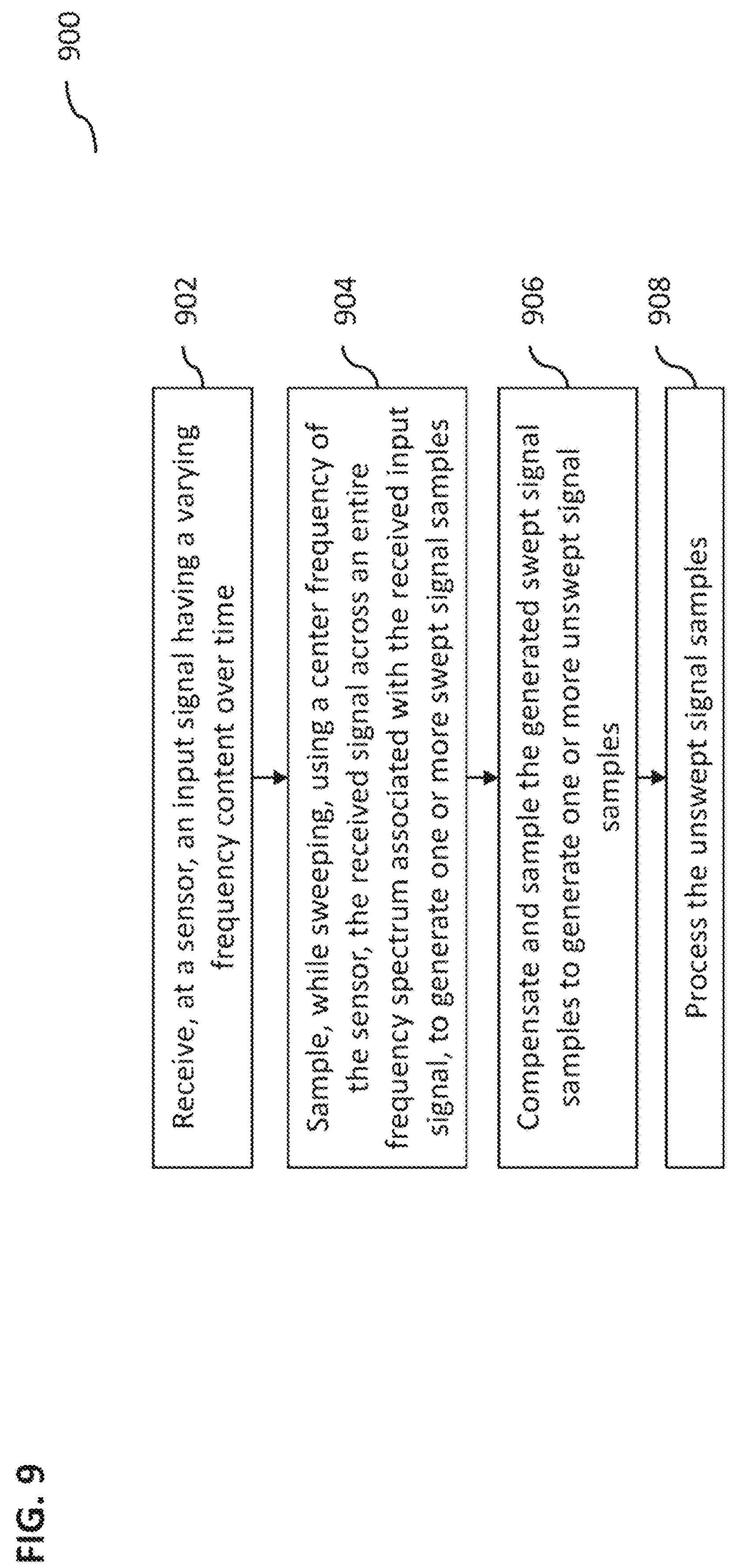
FIG. 9 illustrates an exemplary process, according to some implementations of the current subject matter.

FIG. 9 illustrates an exemplary method 900 for executing high resolution spectrum monitoring, according to some implementations of the current subject matter. At 902, an input signal having a frequency varying over time may be received at a sensor having an antenna (e.g., antenna 202 shown in FIG. 2*a* or antenna 302 shown in FIG. 3*a*).

At 904, one or more samples of the received input signal may be sampled. The samples of the received input signal may include one or more swept signal samples generated by sweeping. Sweeping of the received input signal may be performed using a center frequency of the sensor. The sweeping may be performed across an entire frequency spectrum associated with the received input signal to generate one or more swept signal samples. The sweeping may be performed by the sweep frequency (chirp) generation component 206 shown in FIG. 2*a* and/or component 306 shown in FIG. 3*a*. The swept signals and the received input signal may be mixed by the mixer 204, 304 (as shown in FIGS. 2*a*, 3*a*, respectively). In some implementations, sampling of the samples of the received signal may be performed while performing the sweeping.

At 906, optionally, compensating and sampling the generated swept signal samples may be performed to generate one or more unswept signal samples. The unsweeping may be executed using sweep frequency (chirp) compensation and sampling components 208 (shown in FIG. 2*a*) and/or 308 (shown in FIG. 3*a*).

At 908, the signal samples may be processed by the hosting components 210, 310 (shown in FIGS. 2*a*, 3*a*, respectively).

In some implementations, the current subject matter may include one or more of the following optional features. In some implementations, sweeping may further include down-converting the one or more swept signal samples to one or more baseband signal samples. The method may also include compensating and sampling the generated swept signal samples to generate one or more unswept signal samples. Compensating and sampling may be configured to remove one or more distortions from the generated unswept signal samples. The processing may be applied to the generated unswept signal samples having distortions removed.

In some implementations, down-converting may be performed using at least one of the following: direct down-converting of the one or more swept signal samples, down-converting the one or more swept signal samples from a radio frequency to an intermediate frequency, and any combination thereof.

In some implementations, the method may also include monitoring, using the sensor, based on the samples of the received input signal, a usage of the frequency spectrum. The method may further include determining, based on the sweeping, an amount of gain to apply to the one or more swept signal samples.

In some implementations, a spectrum sensor may be configured to perform the sweeping using the center frequency of the spectrum sensor. In some implementations, the spectrum sensor may include at least one of the following: a software defined radio, a custom designed radio, and any combinations thereof, and/or one or more of its components.

In some implementations, the method may further include selecting one or more frequency bands in a plurality of frequency bands for the sweeping.

In some implementations, the sensor may include a local oscillator (LO) (e.g., part of component 206 shown in FIG. 2*a* or part of component 306 shown in FIG. 3*a*) configured to perform the sweeping by generating, using a frequency synthesizer of the sensor, for each signal sample, a tuning tone having a sweep reference signal. The generated tuning tone may be mixed (e.g., using mixer 204 shown in FIG. 2*a* or mixer 304 shown in FIG. 3*a*) with the received signal. The received signal may be amplified to generate one or more mixed signal samples. The mixed signal may then be down-converted to one or more baseband signal samples, and then filtered and sampled, using an analog-to-digital converter of the sensor, to generate the one or more swept signal samples.

In some implementations, the compensating and sampling may include calibrating the frequency synthesizer using the sweep reference signal, measuring, for each signal sample, an observed frequency, and determining, for each signal sample, the center frequency used during the sweeping, based a difference between the observed frequency and the sweep reference signal. Further, the compensating and sampling may further include compensating the generated swept signal samples using the determined center frequency.

In some implementations, the method may further include filtering, using one or more filtering components, the mixed signal samples, sampling, using one or more sampling components, the filtered mixed signal samples, and storing the signal samples.

In some implementations, receiving may further include filtering the received input signal prior to the sweeping (e.g., as shown in FIG. 3*a*). The filtered received input signal and a sweep frequency chirp generated during the sweeping may be mixed to generate one or more mixed signal samples. Using an intermediate frequency filter component (e.g., IF filter 307 shown in FIG. 3*a*), the mixed signal samples may be filtered to generate a moving frequency window. The filtered mixed signal samples may be direct down-converted to one or more baseband signal samples. Filtering and sampling may then be applied to the baseband signal samples to generate the swept signal samples.

In some implementations, filtering may be performed using a predetermined fixed intermediate frequency filter.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

Although ordinal numbers such as first, second, and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

These computer programs, which can also be referred to programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more client computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include clients and servers. A client and server are generally, but not exclusively, remote from each other and typically interact through a communication network. The relationship of client and server arises by virtue of computer programs running on the respective computers and having a client-server relationship to each other.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed:

1. A method, comprising:

receiving, at a sensor, an input signal having a varying frequency content over time;

sampling one or more samples of the input signal, wherein the one or more samples of the input signal comprise one or more swept signal samples generated by sweeping by down-converting the one or more swept signal samples to one or more baseband signal samples, using a center frequency of the sensor, the input signal across an entire frequency spectrum associated with the input signal, wherein sampling of the one or more samples of the input signal is performed while performing the sweeping;

compensating and sampling the one or more swept signal samples to generate one or more unswept signal samples;

removing one or more distortions from the one or more unswept signal samples; and processing the one or more unswept signal samples having the one or more distortions removed.

2. The method of claim 1, wherein the down-converting is performed using at least one of: direct down-converting of the one or more swept signal samples, down-converting the one or more swept signal samples from a radio frequency to an intermediate frequency, and any combination thereof.

3. The method of claim 1, further comprising monitoring, using the sensor, based on the one or more samples of the input signal, a usage of the entire frequency spectrum.

4. The method of claim 1, further comprising determining, based on the sweeping, an amount of gain to apply to the one or more swept signal samples.

5. The method of claim 1, wherein a spectrum sensor is configured to perform the sweeping using the center frequency of the spectrum sensor.

6. The method of claim 5, wherein the spectrum sensor includes at least one of: a software defined radio, a custom designed radio, and any combinations thereof.

7. The method of claim 1, further comprising selecting one or more frequency bands in a plurality of frequency bands for the sweeping.

8. The method of claim 1, wherein the sensor includes a local oscillator configured to perform the sweeping by generating, using a frequency synthesizer of the sensor, for each signal sample, a tuning tone having a sweep reference signal;

mixing the tuning tone with the input signal, wherein the input signal is amplified, to generate one or more mixed signal samples;

down-converting the one or more mixed signal samples to one or more baseband signal samples; and filtering and sampling, using an analog-to-digital converter of the sensor, the baseband signal samples to generate the one or more swept signal samples.

9. The method of claim 8, further comprising compensating and sampling executed by calibrating the frequency synthesizer using the sweep reference frequency signal;

measuring, for each signal sample, an observed frequency; and determining, for each signal sample, the center frequency used during the sweeping, based a difference between the observed frequency and the sweep reference signal.

10. The method of claim 9, wherein the compensating and sampling further comprises compensating the one or more swept signal samples using the center frequency.

11. The method of claim 8, further comprising filtering, using one or more filtering components, the one or more mixed signal samples;

sampling, using one or more sampling components, the one or more mixed signal samples; and storing the one or more signal samples.

12. The method of claim 1, wherein the receiving further comprises filtering the input signal prior to the sweeping.

13. The method of claim 12, further comprises mixing the received input signal and a sweep frequency chirp generated during the sweeping, to generate one or more mixed signal samples;

filtering, using an intermediate frequency filter component, the one or more mixed signal samples to generate a moving frequency window;

direct down-converting the one or more mixed signal samples to one or more baseband signal samples; and filtering and sampling the baseband signal samples to generate the one or more swept signal samples.

14. The method of claim 13, wherein the filtering is performed using a predetermined fixed intermediate frequency filter.

15. A system comprising:

at least one programmable processor; and a non-transitory machine-readable medium storing instructions that, when executed by the at least one programmable processor, cause the at least one programmable processor to perform operations comprising:

receiving, at a sensor, an input signal having a varying frequency content over time;

sampling one or more samples of the input signal, wherein the one or more samples of the input signal comprise one or more swept signal samples generated by sweeping by down-converting the one or more swept signal samples to one or more baseband signal samples, using a center frequency of the sensor, the input signal across an entire frequency spectrum associated with the input signal, wherein sampling of the one or more samples of the input signal is performed while performing the sweeping;

compensating and sampling the one or more swept signal samples to generate one or more unswept signal samples;

removing one or more distortions from the one or more unswept signal samples; and processing the one or more unswept signal samples having the one or more distortions removed.

16. The system of claim 15, wherein down-converting is performed using at least one of: direct down-converting of the one or more swept signal samples, down-converting the one or more swept signal samples from a radio frequency to an intermediate frequency, and any combination thereof.

17. The system of claim 16, wherein the operations further comprise monitoring, using the sensor, based on the one or more samples of the input signal, a usage of the entire frequency spectrum.

18. A computer program product comprising a non-transitory machine-readable medium storing instructions that, when executed by at least one programmable processor, cause the at least one programmable processor to perform operations comprising:

receiving, at a sensor, an input signal having a varying frequency content over time;

sampling one or more samples of the input signal, wherein the one or more samples of the input signal comprise one or more swept signal samples generated by sweeping by down-converting the one or more swept signal samples to one or more baseband signal samples, using a center frequency of the sensor, the input signal across an entire frequency spectrum associated with the input signal, wherein sampling of the one or more samples of the input signal is performed while performing the sweeping;

compensating and sampling the one or more swept signal samples to generate one or more unswept signal samples;

removing one or more distortions from the one or more unswept signal samples; and processing the one or more unswept signal samples having the one or more distortions removed.

* * * * *